(12) United States Patent
Teramura

(10) Patent No.: US 7,724,790 B2
(45) Date of Patent: May 25, 2010

(54) METHOD AND APPARATUS FOR DRIVING SEMICONDUCTOR LASERS, AND METHOD AND APPARATUS FOR DERIVING DRIVE CURRENT PATTERNS FOR SEMICONDUCTOR LASERS

(75) Inventor: Yuichi Teramura, Kanagawa-ken (JP)

(73) Assignee: FUJIFILM Corporation, Tokyo (JP)

( * ) Notice: Subject to any disclaimer, the term of this patent is extended or adjusted under 35 U.S.C. 154(b) by 174 days.

(21) Appl. No.: 11/994,396

(22) PCT Filed: Jul. 3, 2006

(86) PCT No.: PCT/JP2006/313627

§ 371 (c)(1),
(2), (4) Date: May 23, 2008

(87) PCT Pub. No.: WO2007/004726

PCT Pub. Date: Jan. 11, 2007

(65) Prior Publication Data

US 2008/0279235 A1    Nov. 13, 2008

(30) Foreign Application Priority Data

Jul. 1, 2005    (JP) .............................. 2005-193561

(51) Int. Cl.
*H01S 3/13*    (2006.01)
*H01S 3/00*    (2006.01)

(52) U.S. Cl. .............................. 372/29.015; 372/29.021; 372/38.07

(58) Field of Classification Search ............ 372/29.015, 372/29.021, 38.07
See application file for complete search history.

(56) References Cited

U.S. PATENT DOCUMENTS

| 5,966,394 A | 10/1999 | Spurr et al. |
| 2003/0052105 A1 | 3/2003 | Nagano et al. |
| 2004/0247240 A1 | 12/2004 | Teramura et al. |
| 2005/0018255 A1 | 1/2005 | Nakaya et al. |

FOREIGN PATENT DOCUMENTS

| JP | 8-274395 A | 10/1996 |
| JP | 8-288581 A | 11/1996 |
| JP | 10-173261 A | 6/1998 |
| JP | 11-70699 A | 3/1999 |
| JP | 2001-202645 A | 7/2001 |
| JP | 2002-237075 A | 9/2002 |
| JP | 2003-80604 A | 3/2003 |
| JP | 2003-338660 A | 11/2003 |
| JP | 2004-96062 A | 3/2004 |
| JP | 2004-310081 A | 11/2004 |
| JP | 2005-55881 A | 3/2005 |

*Primary Examiner*—Armando Rodriguez
(74) *Attorney, Agent, or Firm*—Sughrue Mion, PLLC

(57) ABSTRACT

Semiconductor lasers are driven such that high output laser beams are stably obtained without a long start up time. A method for driving semiconductor lasers by automatic current control or automatic power control with a constant current source involves the steps of: generating a pattern of drive current values for the semiconductor lasers, which is defined according to the amount of time which has elapsed since initiating driving thereof, that enables obtainment of substantially the same light output as a target light output by the automatic current control or the automatic power control; and varying the drive current of the semiconductor lasers in stepwise increments according to the pattern for a predetermined period of time from initiation of drive thereof. A single pattern is used in common to drive the plurality of semiconductor lasers.

17 Claims, 18 Drawing Sheets

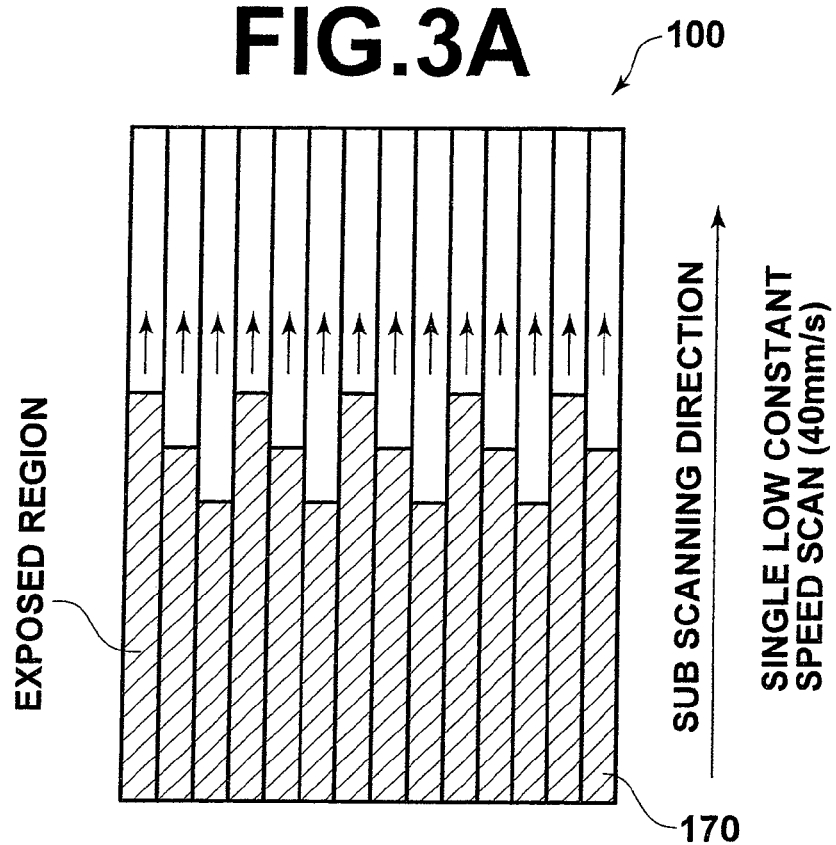
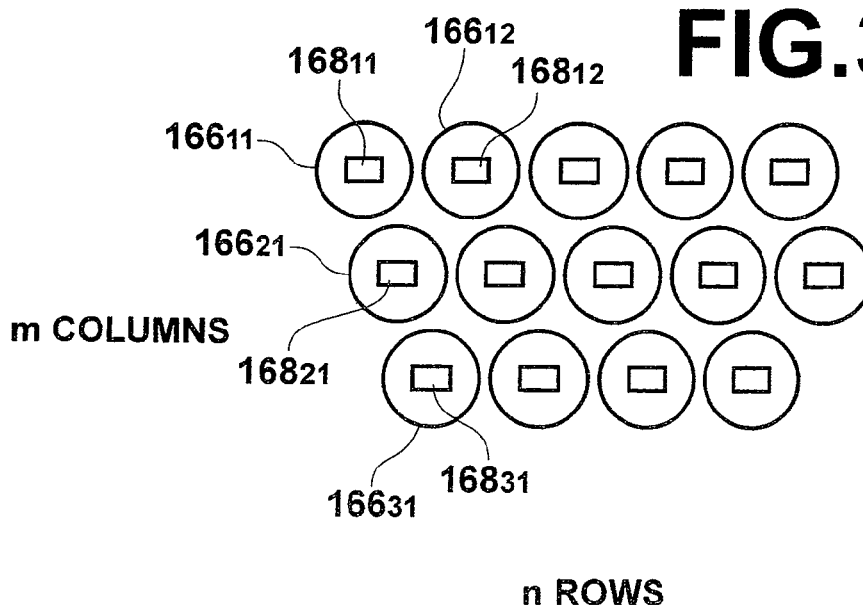

METHOD AND APPARATUS FOR DRIVING SEMICONDUCTOR LASERS, AND METHOD AND APPARATUS FOR DERIVING DRIVE CURRENT PATTERNS FOR SEMICONDUCTOR LASERS

TECHNICAL FIELD

The present invention relates to a method and apparatus for driving semiconductor lasers.

The present invention also relates to a method for generating a drive current pattern, which is utilized in the method for driving semiconductor lasers.

Further, the present invention relates to an exposure apparatus for exposing photosensitive materials with light, which is emitted from semiconductor lasers and modulated by spatial light modulating elements.

BACKGROUND ART

Semiconductor lasers are in practical use in many fields. Japanese Unexamined Patent Publication No. 2005-055881 discloses a laser exposure apparatus that modulates light emitted from semiconductor lasers with spatial light modulating elements, and exposes photosensitive materials with the modulated light.

In addition, GaN type semiconductor lasers that emit laser beams having wavelengths in the vicinity of 400 nm are known, as disclosed, for example, in Japanese Unexamined Patent Publication No. 2004-096062. Japanese Unexamined Patent Publication No. 2005-055881 discloses that the exposure apparatus employs this type of semiconductor laser as an exposure light source.

In applications of semiconductor lasers, such as when they are employed in the aforementioned exposure apparatus, it is desired to drive the semiconductor lasers such that their light output is constant. Known methods for driving semiconductor lasers in this manner include an ACC (Automatic Current Control) drive method, and an APC (Automatic Power Control) drive method, as disclosed in Japanese Unexamined Patent Publication No. 8(1996)-274395.

The drive current/light output properties of semiconductor lasers change due to self heating and the like. Therefore, it is recognized that the ACC drive method, in which drive current is controlled to be constant, has a drawback that the light output changes after the laser is turned on. This defect occurs particularly conspicuously in high output semiconductor lasers. Similarly, this defect occurs conspicuously in laser apparatuses, in which pluralities of semiconductor lasers are mounted. Further, blue-violet GaN type semiconductor lasers have poorer luminous efficiency and generate a greater amount of heat than red lasers. Therefore, the light output changes more conspicuously in blue-violet GaN type semiconductor lasers.

In view of these circumstances, the APC drive method is generally employed to obtain stable light output. In the APC drive method, the drive current is controlled by: causing a portion of a laser beam emitted by a semiconductor laser to enter a monitoring photodetector; and creating a feedback loop such that a monitor current, which is generated proportionate to the light output of the semiconductor laser, becomes constant.

In the APC drive method, however, a portion of the emitted light is utilized as an input to the feedback loop, causing a drawback that the amount of light to be utilized for the intended purpose is reduced. In addition, additional costs become necessary to provide a light amount feedback loop circuit.

Meanwhile, in laser exposure apparatuses such as that described above, the light output of the semiconductor lasers is a factor that determines the takt time of exposure processes. Therefore, obtainment of stable high output laser beams at low cost is desired. However, in the case that the ACC drive method is employed to obtain stable light output, the laser exposure apparatuses must stand by until the temperature of the semiconductor lasers stabilizes after they are turned ON. This generates loss in production time, thereby increasing the takt time of the laser exposure apparatuses. The increase in the takt time deteriorates the productivity of exposure processes.

Constantly keeping the semiconductor lasers in an ON state may be considered as a method to eliminate the time loss caused by the aforementioned standby state. However, the life of lasers is determined by the amount of time that they emit light. Therefore, the effective life of the semiconductor lasers is reduced by the amount of time that they are in the ON state and are not being utilized to perform exposure processes. In the case that the percentage of time that the lasers are utilized for exposure within the total time that the lasers in the ON state is 50%, for example, the life of the semiconductor lasers is reduced by approximately ½.

The present invention has been developed in view of the foregoing circumstances. It is an object of the present invention to provide a method and apparatus for driving semiconductor lasers which enables obtainment of stable high output laser beams simply, at low cost, and without a long startup time.

It is another object of the present invention to provide a method and apparatus for deriving drive current patterns, which are employed in the method and apparatus for driving semiconductor lasers.

It is still another object of the present invention to shorten the takt time of exposure apparatuses that expose photosensitive materials with light, which is emitted from semiconductor lasers and modulated by spatial light modulating elements.

DISCLOSURE OF INVENTION

The method for driving semiconductor lasers according to the present invention is a method for driving at least one semiconductor laser by automatic current control or automatic power control, comprising the steps of:

generating a pattern of drive current values for the semiconductor laser, which is defined according to the amount of time which has passed since initiating driving thereof, that enables obtainment of substantially the same light output as a target light output by the automatic current control or the automatic power control; and varying the drive current of the semiconductor laser in stepwise increments according to the pattern for a predetermined period of time from initiation of drive thereof.

It is preferable that:

a single pattern is utilized in common to drive a plurality of semiconductor lasers.

In the case that a single pattern is utilized in common to drive a plurality of semiconductor lasers, it is preferable that:

the pattern is defined as ratios of the drive current values with respect to a constant current value.

In the case that a single pattern is utilized in common to drive a plurality of semiconductor lasers as described above, it is preferable that:

the step of varying the drive current of the semiconductor lasers according to the pattern is performed with a common timing for the plurality of semiconductor lasers.

In the case that a single pattern is utilized in common to drive a plurality of semiconductor lasers, and laser beams emitted from the plurality of semiconductor lasers are multiplexed, it is preferable that:

the step of varying the drive current of the semiconductor lasers according to the pattern is performed with time lags among the plurality of semiconductor lasers.

It is preferable for the method for driving semiconductor lasers of the present invention to be applied to drive a plurality of semiconductor lasers which are fixed on a common heat sink.

It is preferable for the method for driving semiconductor lasers of the present invention to be applied to drive a plurality of semiconductor lasers of an apparatus comprising:

the plurality of semiconductor lasers; and a multiplexing optical fiber, into which laser beams emitted by each of the plurality of semiconductor lasers enter to be multiplexed thereby.

It is preferable for the method for driving semiconductor lasers of the present invention to be applied to drive GaN type semiconductor lasers.

The apparatus for driving semiconductor lasers according to the present invention is an apparatus for driving at least one semiconductor laser by automatic current control or automatic power control, comprising:

memory means, in which a pattern of drive current values for the semiconductor laser, which is defined according to the amount of time which has passed since initiating driving thereof, that enables obtainment of substantially the same light output as a target light output by the automatic current control or the automatic power control is recorded; and current controlling means, for varying the drive current of the semiconductor laser in stepwise increments according to the pattern for a predetermined period of time from initiation of drive of the semiconductor laser.

It is preferable for a configuration to be adopted, wherein:

the current controlling means utilizes a single pattern in common to drive a plurality of semiconductor lasers.

In the case that the above configuration, in which the current controlling means utilizes a single pattern in common to drive the plurality of semiconductor lasers, is adopted, it is preferable that:

the pattern recorded in the memory means is defined as ratios of the drive current values with respect to a constant current value.

In the case that the above configuration, in which the current controlling means utilizes a single pattern in common to drive the plurality of semiconductor lasers, is adopted, it is preferable that:

the current controlling means varies the drive current of the semiconductor lasers according to the pattern with a common timing for the plurality of semiconductor lasers.

In the case that the above configuration, in which the current controlling means utilizes a single pattern in common to drive the plurality of semiconductor lasers, is adopted, and laser beams emitted from the plurality of semiconductor lasers are multiplexed, it is preferable that:

the current controlling means varies the drive current of the semiconductor lasers according to the pattern, with time lags among the plurality of semiconductor lasers.

It is preferable for the apparatus for driving semiconductor lasers to be applied to drive a plurality of semiconductor lasers which are fixed on a common heat sink.

It is preferable for the apparatus for driving semiconductor lasers of the present invention to be applied to drive a plurality of semiconductor lasers of an apparatus comprising:

the plurality of semiconductor lasers; and a multiplexing optical fiber, into which laser beams emitted by each of the plurality of semiconductor lasers enter to be multiplexed thereby.

It is preferable for the apparatus for driving semiconductor lasers of the present invention to be applied to drive GaN type semiconductor lasers.

The method for deriving a semiconductor laser drive current pattern according to the present invention is a method for deriving a pattern for driving semiconductor lasers, which is employed in the method for driving semiconductor lasers of the present invention, comprising the steps of:

supplying at least one semiconductor laser which is to be driven with a predetermined current;

detecting at least a portion of the light emitted from the semiconductor laser with a photodetector;

increasing/decreasing the current such that the output of the photodetector becomes constant;

detecting the current; and designating the increasing/decreasing pattern of the current as the pattern for driving the at least one semiconductor laser.

In the method for deriving a pattern for driving semiconductor lasers according to the present invention, it is preferable that:

the predetermined current is supplied to a plurality of semiconductor lasers to be driven simultaneously;

at least a portion of the light emitted from the plurality of semiconductor lasers is detected by photodetectors; and the predetermined current is increased/decreased simultaneously such that the outputs of the photodetectors become constant.

The apparatus for deriving a pattern for driving semiconductor lasers according to the present invention is an apparatus for deriving a pattern for driving semiconductor lasers, which is employed by the apparatus for driving semiconductor lasers of the present invention, comprising:

a constant current circuit, for supplying at least one semiconductor laser which is to be driven with a predetermined current;

a photodetector, for detecting at least a portion of the light emitted from the semiconductor laser;

means for increasing/decreasing the current such that the output of the photodetector becomes constant; and means for detecting the current and designating the increasing/decreasing pattern of the current as the pattern for driving the at least one semiconductor laser.

In the apparatus for deriving a pattern for driving semiconductor lasers of the present invention, it is preferable that:

the constant current circuit supplies the predetermined current to a plurality of semiconductor lasers to be driven simultaneously;

the photodetector detects at least a portion of the light emitted from the plurality of semiconductor lasers is detected; and the means for increasing/decreasing the current simultaneously increases/decreases the predetermined current such that the outputs of the photodetectors become constant.

The exposure apparatus according to the present invention is an exposure apparatus for exposing a photosensitive material with modulated light, comprising:

at least one semiconductor laser;

at least one spatial light modulating element, for modulating light emitted by the at least one semiconductor laser; and an apparatus for driving semiconductor lasers of the present invention.

The method for driving semiconductor lasers according to the present invention comprises the steps of: generating a pattern of drive current values for at least one semiconductor laser, which is defined according to the amount of time which has passed since initiating driving thereof, that enables obtainment of substantially the same light output as a target light output by the automatic current control or the automatic power control; and varying the drive current of the semiconductor laser in stepwise increments according to the pattern for a predetermined period of time from initiation of drive thereof. Therefore, the light output changes in a stepwise manner, as illustrated in FIG. 18, for example. When compared against the light output of a conventional method as illustrated in FIG. 17, the constant target light output is approached in a shorter amount of time, and the range of fluctuation $\Delta P_2$ of the light output is smaller than the range of fluctuation $\Delta P_1$ of the conventional method.

Thereby, high output laser beams can be stably obtained without a long start up time. In addition, the structure for driving semiconductor lasers in this manner can be produced by slightly modifying a constant current source, which is generally provided in semiconductor laser apparatuses. Accordingly, a configuration that realizes the method can be produced simply and at low cost.

Note that during the period of time that semiconductor lasers are driven in a steady state after applying the method for driving semiconductor lasers of the present invention, either the ACC drive method or the APC method may be utilized. In the case that the ACC drive method is utilized, the current control circuit therefor may be utilized to perform the stepwise variations in drive current of the method according to the present invention, which would simplify the structure of a drive circuit. In addition, in the case that the ACC drive method is employed, it is not necessary to split laser beams, which are to be utilized, in order to monitor the light output. Therefore, the utilization efficiency of the laser beams is increased. Further, photodetectors and feedback loop circuits for monitoring the light output become unnecessary, which will decrease the cost of apparatuses in which the semiconductor lasers are provided.

A single pattern for varying the drive currents of semiconductor lasers in stepwise increments maybe employed in common to drive a plurality of semiconductor lasers. In this case, a small capacity memory means may be employed to record the pattern therein.

The pattern may be defined as ratios of the drive current values with respect to a constant current value. In this case, the pattern may be employed in common to drive the plurality of semiconductor lasers to achieve stable output therefrom, even if the drive current/light output properties of a plurality of semiconductor lasers differ. In contrast, in the case that the pattern is defined as the drive current values themselves, it becomes necessary to define a pattern for each semiconductor laser in the case that the drive current/light output properties of a plurality of semiconductor lasers differ. This would necessitate a large capacity memory means to record a great number of patterns therein. Further, in the case that the great number of patterns are utilized, a long amount of time would be required to process the patterns, and the configuration of a processing apparatus will become complex.

In the method for driving semiconductor lasers according to the present invention, the step of varying the drive current of the semiconductor lasers according to the pattern may be performed with a common timing for the plurality of semiconductor lasers. In this case, only a single current control means would be necessary, which enables manufacture of a driving apparatus at low cost.

In the method for driving semiconductor lasers according to the present invention, in the case that a single pattern is utilized in common to drive a plurality of semiconductor lasers, and laser beams emitted from the plurality of semiconductor lasers are multiplexed the step of varying the drive current of the semiconductor lasers according to the pattern may be performed with time lags among the plurality of semiconductor lasers. In this case, slight variations in light output among each of the semiconductor lasers prior to multiplexing are canceled, and variations in light output of a multiplexed laser beam can be smoothed.

The method for driving semiconductor lasers of the present invention may be applied to drive a plurality of semiconductor lasers which are fixed on a common heat sink. In this case, the method is particularly effective in stabilizing light output. That is, in a configuration such as that described above, the properties of each of the semiconductor lasers may change due to synergistic heat generated thereby. Even in this case, if a single common pattern is employed to drive the plurality of semiconductor lasers, fluctuations in light output due to the synergistic heat generated thereby can be corrected.

The method for driving semiconductor lasers of the present invention may be applied to drive a plurality of semiconductor lasers of an apparatus comprising: the plurality of semiconductor lasers; and a multiplexing optical fiber, into which laser beams emitted by each of the plurality of semiconductor lasers enter to be multiplexed thereby. In this case, the stabilization effect of light output is particularly conspicuous.

That is, in the above structure, there are cases in which output of the multiplexed laser beam fluctuate, not only due to differences in the drive current/light output properties of the plurality of semiconductor lasers that are driven, but also due to the heat generated thereby. The fluctuations are caused by thermal expansion of structural members of the apparatus due to the generated heat. The thermal expansion shifts the laser beams and the optical fibers from their coaxial states, thereby changing the input efficiencies of the laser beams with respect to the optical fibers. Further, there are cases in which the beam profiles of the laser beams fluctuate during the period from drive initiation to a steady driving state. The input efficiencies of the laser beams with respect to the optical fibers may change in these cases as well.

However, if the pattern for driving the semiconductor lasers is generated by detecting the laser beam emitted from the optical fiber, a pattern that reflects the changes in input efficiencies can be obtained. Therefore, fluctuations in light output caused by the changes in input efficiencies can also be corrected.

Further, the method for driving semiconductor lasers of the present invention is particularly effective in stabilizing light output when the semiconductor lasers to be driven are GaN type semiconductor lasers. GaN type semiconductor lasers generate more heat in comparison with other types of semiconductor lasers, such as GaAs type semiconductor lasers. Therefore, the drive current/light output properties thereof fluctuate conspicuously during a period of time from drive initiation to a steady driving state. However, by applying the method for driving semiconductor lasers of the present invention, the fluctuations in the drive current/light output properties of GaN type semiconductor lasers can be corrected, thereby enabling stabilization of light output thereby.

In addition, GaN type semiconductor lasers have the characteristic that only the oscillation threshold current thereof changes in response to temperature changes, at or near room temperature. That is, the slope efficiency thereof does not change greatly in response to temperature changes at or near room temperature. Therefore, in the case that the semiconductor lasers to be driven are GaN type semiconductor lasers, parameters, which are determined for an arbitrary current range, can be utilized within substantially all output ranges. That is, the parameters do not need to be changed according to changes in output.

Meanwhile, the apparatus for driving semiconductor lasers of the present invention is capable of executing the method of driving semiconductor lasers of the present invention described above.

The method for deriving drive current patterns for driving semiconductor lasers of the present invention can efficiently generate drive current patterns to be utilized in the method fro driving semiconductor lasers of the present invention.

As described in detail above, the method for driving semiconductor lasers of the present invention enables obtainment of stable high output laser beams simply, at low cost, and without a long startup time. Accordingly, the exposure apparatus of the present invention, which employs the driving apparatus that executes this method, has a short standby time until the output of laser beams stabilizes, which shortens the takt time of image exposure. Therefore, the semiconductor lasers, which are the exposure light sources of the exposure apparatus, can be replaced less frequently, thereby reducing the running costs of the exposure apparatus as well.

BRIEF DESCRIPTION OF DRAWINGS

FIG. 3A is a plan view that illustrates exposed regions, which are formed on a photosensitive material.

FIG. 3B is a diagram that illustrates the arrangement of exposure areas exposed by exposure heads.

BEST MODE FOR CARRYING OUT THE INVENTION

Hereinafter, preferred embodiments of the present invention will be described in detail with reference to the attached drawings. First, an image exposure apparatus according to a first embodiment of the present invention will be described.

[Configuration of the Image Exposure Apparatus]

Figure 1:
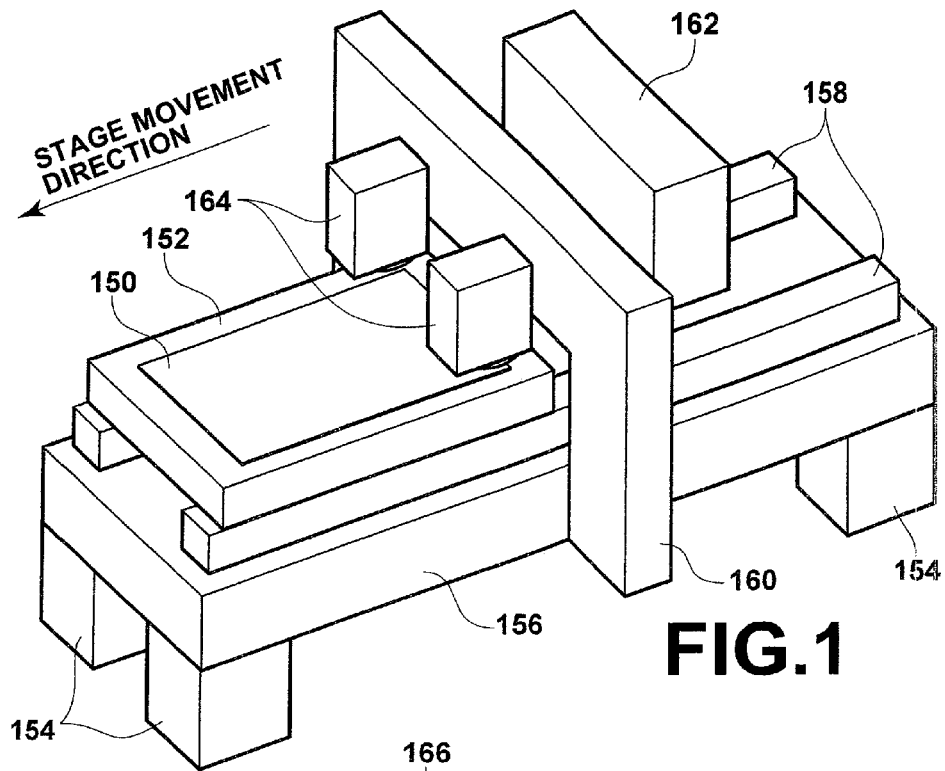
FIG. 1 is a perspective view that illustrates the outer appearance of an image exposure apparatus according to a first embodiment of the present invention.

As illustrated in FIG. 1, the image exposure apparatus is equipped with a planar moving stage 152, for holding sheets of photosensitive material 150 thereon by suction. Amounting base 156 is supported by four legs 154. Two guides 158 that extend along the stage movement direction are provided on the upper surface of the mounting base 156. The stage 152 is provided such that its longitudinal direction is aligned with the stage movement direction, and supported by the guides 158 so as to be movable reciprocally thereon. Note that the image exposure apparatus is also equipped with a stage driving apparatus 304 (refer to FIG. 15), as a sub scanning means for driving the stage 152 along the guides 158.

A C-shaped gate 160 is provided at the central portion of the mounting base so as to straddle the movement path of the stage 152. The ends of the C-shaped gate 160 are fixed to side edges of the mounting base 156. A scanner 162 is provided on a first side of the gate 160, and a plurality (two, for example) of sensors 164 for detecting the leading and trailing ends of the photosensitive material 150 are provided on a second side of the gate 160. The scanner 162 and the sensors 164 are individually mounted on the gate 160, and fixed above the movement path of the stage 152. Note that the scanner 162 and the sensors 164 are connected to a controller (not shown) for controlling the operations thereof.

Figure 2:
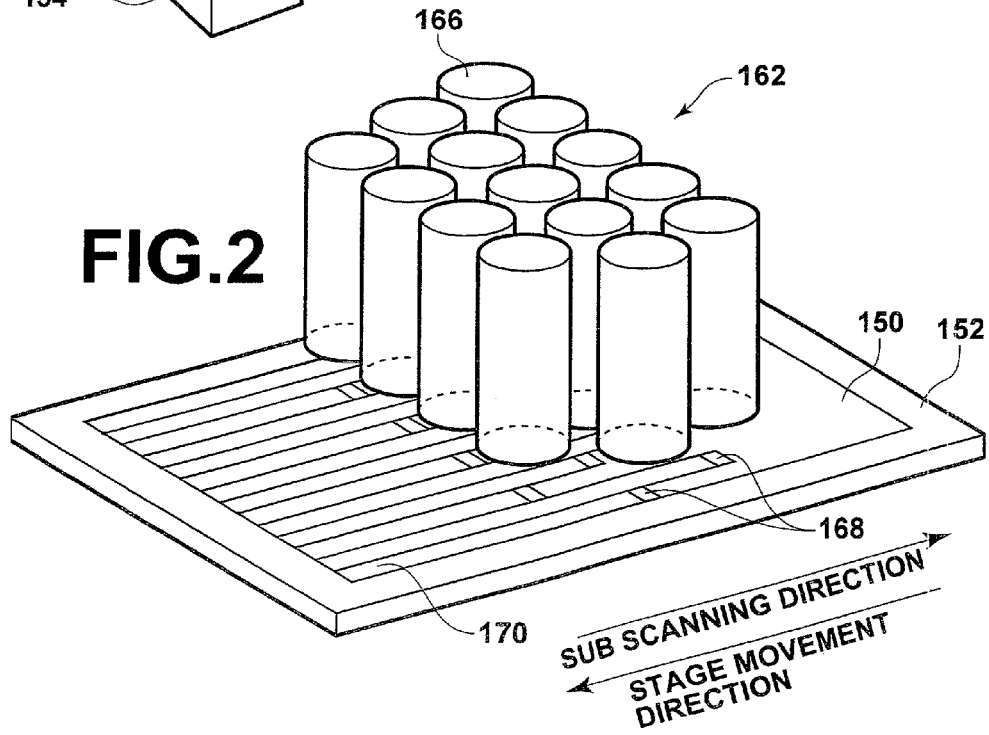
FIG. 2 is a perspective view that illustrates the construction of a scanner of the image exposure apparatus according to the first embodiment of the present invention.

The scanner 162 is equipped with a plurality (14, for example) of exposure heads 166, arranged in an approximate matrix having m rows and n columns (3 rows and 5 columns, for example), as illustrated in FIG. 2 and FIG. 3B. In this example, four exposure heads 166 are provided in the third row, due to constraints imposed by the width of the photosensitive material 150. Note that an individual exposure head arranged in an $m^{th}$ row and an $n^{th}$ column will be denoted as an exposure head $166_{m,n}$.

An exposure area 168, which is exposed by the exposure heads 166, is a rectangular area having its short sides in the sub-scanning direction. Accordingly, band-like exposed regions 170 are formed on the photosensitive material 150 by each of the exposure heads 166, accompanying the movement of the stage 152. Note that an individual exposure area, exposed by an exposure head arranged in an $m^{th}$ row and an $n^{th}$ column will be denoted as an exposure area $168_{m,n}$.

As illustrated in FIG. 3B, each of the rows of the exposure heads 166 is provided staggered a predetermined interval (a natural number multiple of the long side of the exposure area, 2 times in the present embodiment) with respect to the other rows. This is to ensure that the band-like exposed regions 170 have no gaps therebetween in the direction perpendicular to the sub scanning direction, as illustrated in FIG. 3A. Therefore, the portion between an exposure area $168_{1,1}$ and $168_{1,2}$ of the first row, which cannot be exposed thereby, can be exposed by an exposure area $168_{2,1}$ of the second row and an exposure area $168_{3,1}$ of the third row.

Each of the exposure heads $166_{1,1}$ through $168_{m,n}$ are equipped with a DMD 50 (Digital Micro mirror Device) by Texas Instruments (U.S.), for modulating light beams incident thereon according to each pixel of image data. The DMD's 50 are connected to a controller 302 to be described later (refer to FIG. 15), comprising a data processing section and a mirror drive control section. The data processing section of the controller 302 generates control signals for controlling the drive of each micro mirror of the DMD 50 within a region that should be controlled for each exposure head 166, based on input image data. Note that the "region that should be controlled" will be described later. The mirror drive control section controls the angle of a reflective surface of each micro mirror of the DMD 50 for each exposure head 166, according to the control signals generated by the data processing section. Note that control of the angle of the reflective surface will be described later.

Figure 4:
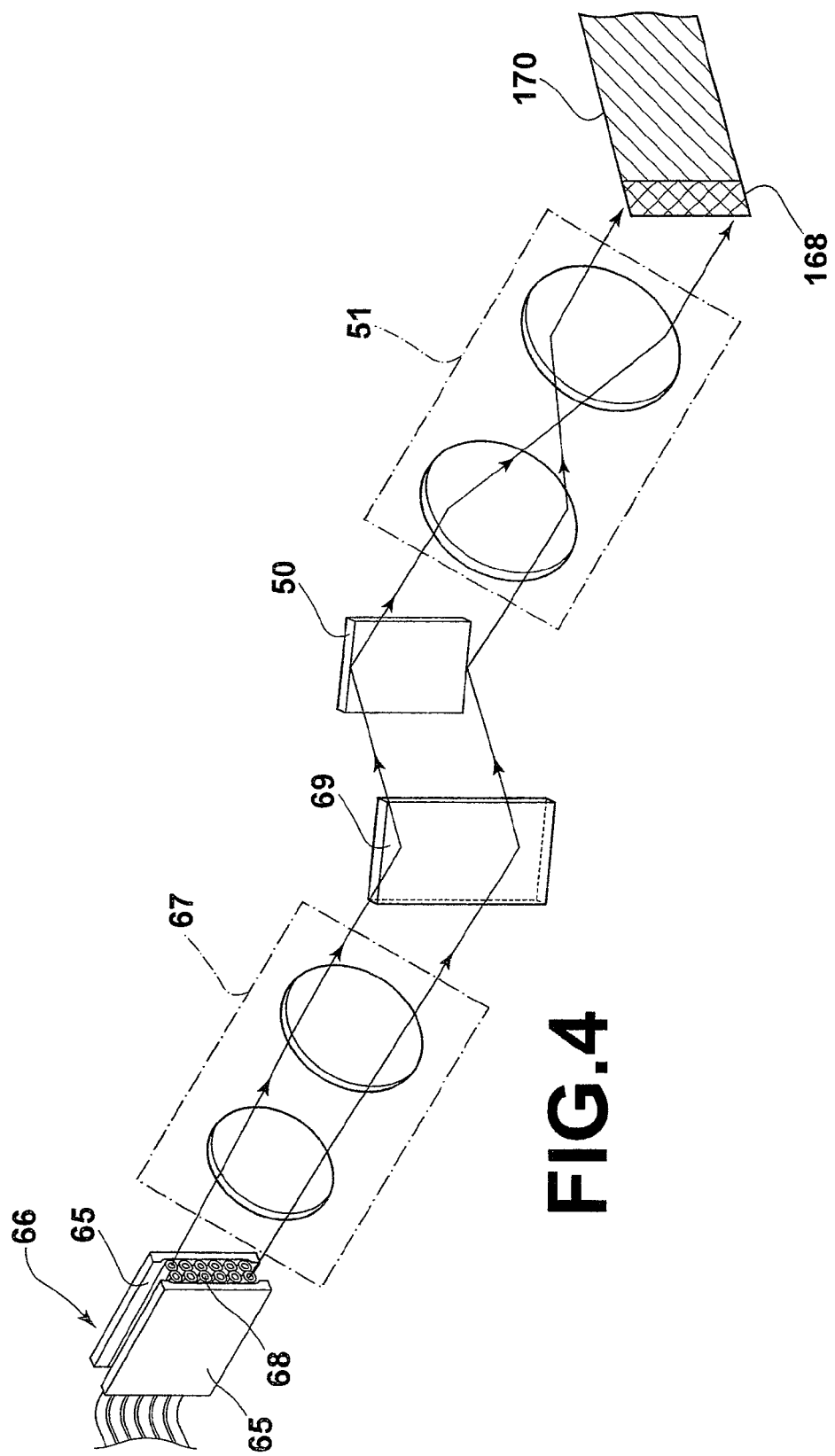
FIG. 4 is a perspective view that illustrates the schematic construction of an exposure head of the image exposure apparatus according to the first embodiment of the present invention.

A fiber array light source 66; an optical system 67; and a mirror 69 are provided in this order, at the light incident side of the DMD 50. The fiber array light source 66 comprises a laser emitting section, constituted by a plurality of optical fibers having their light emitting ends (light emitting points) aligned in a direction corresponding to the longitudinal direction of the exposure area 168. The optical system 67 corrects laser beams emitted from the fiber array light source 66 to condense them onto the DMD 50. The mirror 69 reflects the laser beams, which have passed through the optical system 67, toward the DMD 50. Note that the optical system 67 is schematically illustrated in FIG. 4.

As illustrated in detail in FIG. 5, the optical system 67 comprises: a condensing lens 71, for condensing the laser beams B emitted from the fiber array light source 66 as illuminating light; a rod-like optical integrator 72 (hereinafter, referred to simply as "rod integrator 72"), which is inserted into the optical path of the light which has passed through the condensing lens 71; and a collimating lens 74, provided downstream from the rod integrator 72, that is, toward the side of the mirror 69. The condensing lens 71, the rod integrator 72 and the collimating lens 74 cause the laser beams emitted from the fiber array light source to enter the DMD 50 as a light beam which is close to collimated light and which has uniform beam intensity across its cross section. The shape and the operation of the rod integrator 72 will be described in detail later.

The laser beam B emitted through the optical system 67 is reflected by the mirror 69, and is irradiated onto the DMD 50 via a TIR (Total Internal Reflection) prism 70. Note that the TIR prism 70 is omitted from FIG. 4.

A focusing optical system 51, for focusing the laser beam B reflected by the DMD 50 onto the photosensitive material 150, is provided on the light reflecting side of the DMD 50. The focusing optical system 51 is schematically illustrated in FIG. 4, but as illustrated in detail in FIG. 5, the focusing optical system 51 comprises: a first focusing optical system constituted by lens systems 52 and 54; a second focusing optical system constituted by lens systems 57 and 58; a micro lens array 55; and an aperture array 59. The micro lens array 55 and the aperture array 59 are provided between the first focusing optical system and the second focusing optical system.

The DMD 50 is a mirror device having a great number (1024×768, for example) of micro mirrors 62, each of which constitutes a pixel, arranged in a matrix on an SRAM cell 60 (memory cell). A micro mirror 62 supported by a support column is provided at the uppermost part of each pixel, and a material having high reflectivity, such as aluminum, is deposited on the surface of the micro mirror 62 by vapor deposition. Note that the reflectivity of the micro mirrors 62 is 90% or greater, and that the arrangement pitch of the micro mirrors 62 is 13.7 μm in both the vertical and horizontal directions. In addition, the CMOS SRAM cell 60 of a silicon gate, which is manufactured in a normal semiconductor memory manufacturing line, is provided beneath the micro mirrors 62, via the support column, which includes a hinge and a yoke. The DMD 50 is of a monolithic structure.

When digital signals are written into the SRAM cell 60 of the DMD 50, the micro mirrors 62 which are supported by the support columns are tilted within a range of ±α degrees (±12 degrees, for example) with respect to the substrate on which the DMD 50 is provided, with the diagonal line as the center of rotation. FIG. 7A illustrates a state in which a micro mirror 62 is tilted +α degrees in an ON state, and FIG. 7B illustrates a state in which a micro mirror 62 is tilted −α degrees in an OFF state. Accordingly, laser light beams incident on the DMD 50 are reflected toward the direction of inclination of each micro mirror 62, by controlling the tilt of each micro mirror 62 that corresponds to a pixel of the DMD 50 according to image signals, as illustrated in FIG. 6.

Figure 6:
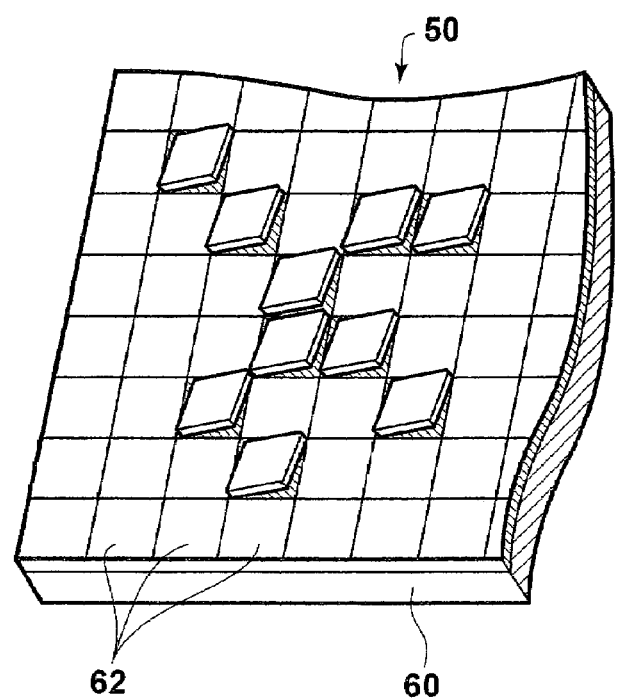
FIG. 6 is a partial magnified diagram that illustrates the construction of a digital micro mirror device (DMD).
Figure 7A:
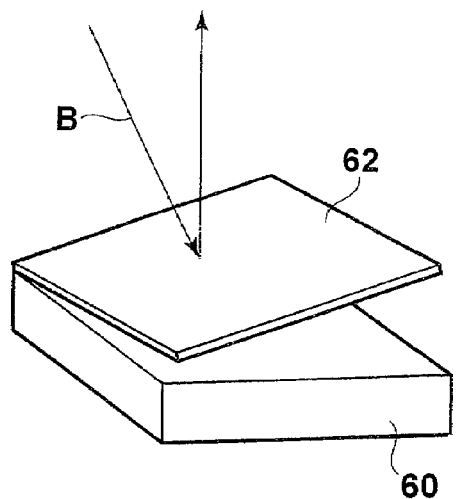
FIG. 7A is a diagram for explaining the operation of the DMD.
Figure 7B:
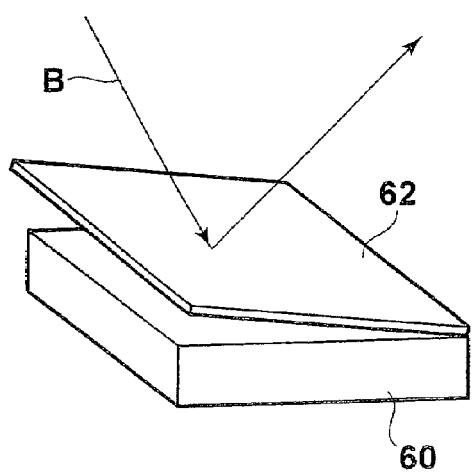
FIG. 7B is a diagram for explaining the operation of the DMD.

Note that FIG. 6 illustrates a magnified portion of a DMD 50 in which the micro mirrors 62 are controlled to be tilted at +α degrees and at −α degrees. The ON/OFF operation of each micro mirror 62 is performed by the controller 302, which is connected to the DMD 50. In addition, a light absorbing material (not shown) is provided in the direction toward which laser beams B reflected by micro mirrors 62 in the OFF state are reflected.

Figure 8A:
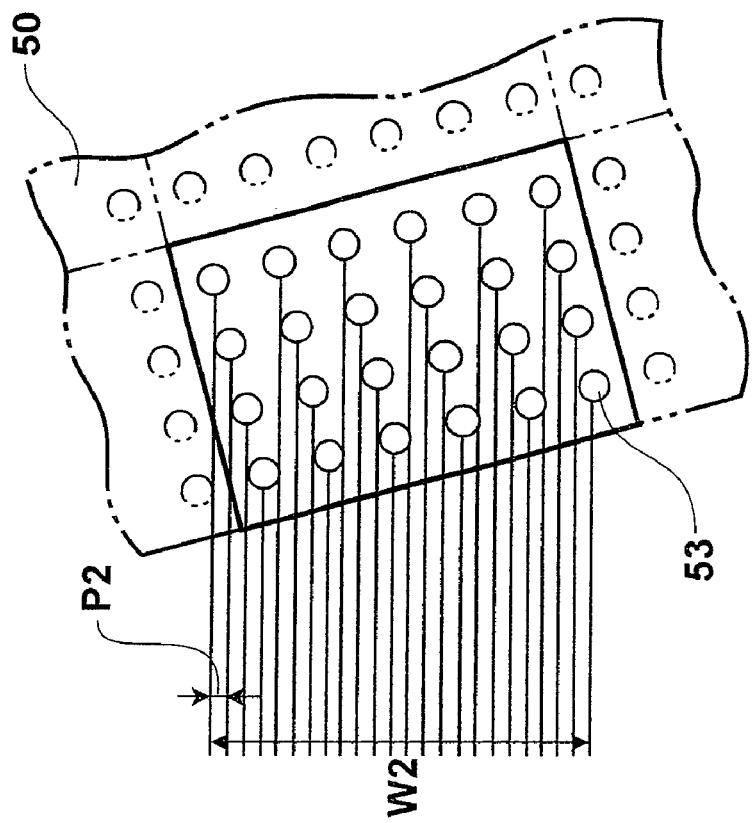
FIG. 8A is a plan view that illustrates the scanning trajectories of exposing beams in the case that the DMD is not inclined.
Figure 8B:
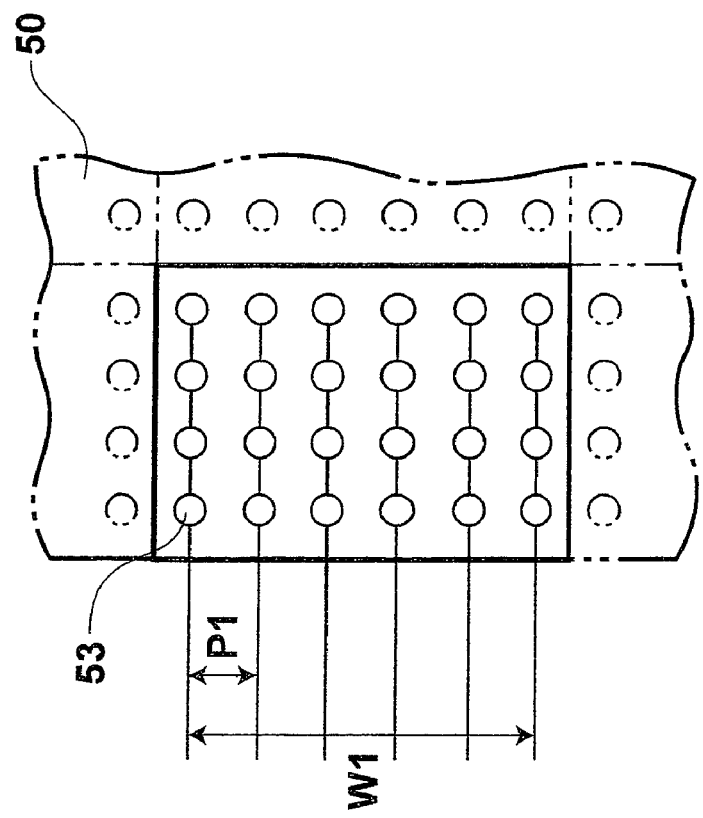
FIG. 8B is a plan view that illustrates the scanning trajectories of the exposing beams in the case that the DMD is inclined.

It is preferable for the DMD 50 to be provided such that its short side is inclined at a slight predetermined angle (0.1° to 5°, for example) with respect to the sub-scanning direction. FIG. 8A illustrates scanning trajectories of reflected light images 53 (exposing beams) of each micro mirror in the case that the DMD 50 is not inclined, and FIG. 8B illustrates the scanning trajectories of the exposing beams 53 in the case that the DMD 50 is inclined.

A great number (756, for example) of columns of rows of a great number (1024, for example) of micro mirrors aligned in the longitudinal direction, are provided in the lateral direction of the DMD 50. As illustrated in FIG. 8B, by inclining the DMD 50, the pitch $P_2$ of the scanning trajectories (scanning lines) of the exposure beams 53 become narrower than the pitch $P_1$ of the scanning lines in the case that the DMD 50 is not inclined. Therefore, the resolution of the image can be greatly improved. Meanwhile, because the angle of inclination of the DMD 50 is slight, the scanning width $W_2$ in the case that the DMD 50 is inclined and the scanning width $W_1$ in the case that the DMD is not inclined are substantially the same.

In addition, the same scanning lines are repeatedly exposed (multiple exposure) by different micro mirror columns. By performing multiple exposure in this manner, it becomes possible to finely control exposure positions with respect to alignment marks, and to realize highly detailed exposure. Seams among the plurality of exposure heads, which are aligned in the main scanning direction, can be rendered virtually seamless by finely controlling the exposure positions.

Note that the micro mirror columns may be shifted by predetermined intervals in the direction perpendicular to the sub-scanning direction to be in a staggered formation instead of inclining the DMD 50, to achieve the same effect.

Figure 9A:
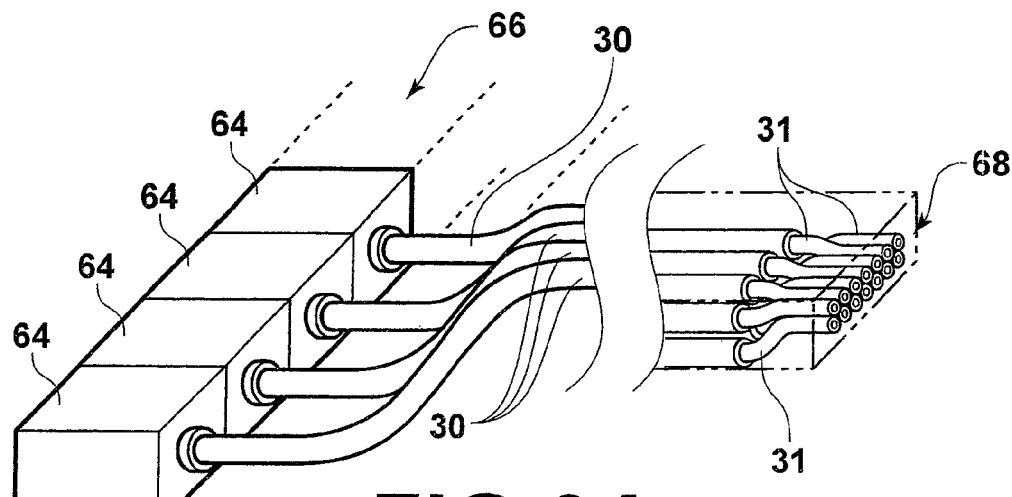
FIG. 9A is a perspective view that illustrates the construction of a fiber array light source.

As illustrated in FIG. 9A, the fiber array light source 66 is equipped with a plurality (14, for example) of laser modules 64. An end of a multi mode optical fiber 30 is coupled to each laser module 64. An optical fiber 31, having the same core diameter as the multi mode optical fiber 30 and a cladding diameter smaller than that of the multi mode optical fiber 30, is coupled to the other end of each multi mode optical fiber 30. As illustrated in detail in FIG. 9B, the optical fibers 31 are arranged such that seven ends of the optical fibers 30 opposite the end at which they are coupled to the multi mode optical fibers are aligned along the main scanning direction perpendicular to the sub scanning direction. Two rows of the seven optical fibers 31 constitute a laser emitting section 68.

Figure 9B:
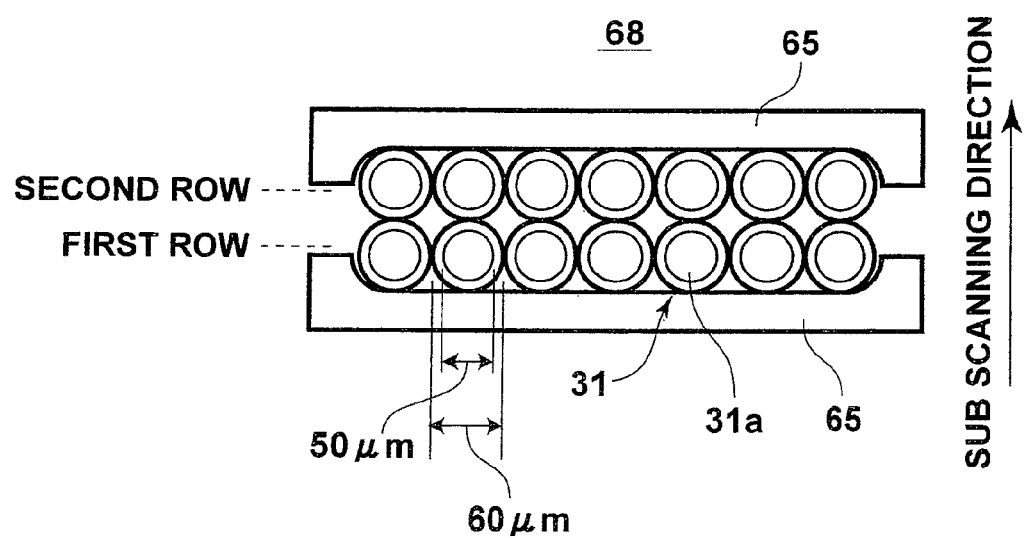
FIG. 9B is a front view that illustrates the arrangement of light emitting points of laser emitting portions of the fiber array light source.

As illustrated in FIG. 9B, the laser emitting section 68, constituted by the ends of the optical fibers 31, is fixed by being sandwiched between two support plates 65, which have flat surfaces. It is desirable for a transparent protective plate, such as that made of glass, to be placed at the light emitting end surfaces of the optical fibers 31. The light emitting end surfaces of the optical fibers 31 are likely to collect dust due to their high optical density and therefore likely to deteriorate. However, by placing the protective plate as described above, adhesion of dust to the end surfaces can be prevented, and deterioration can be slowed.

Figure 10:
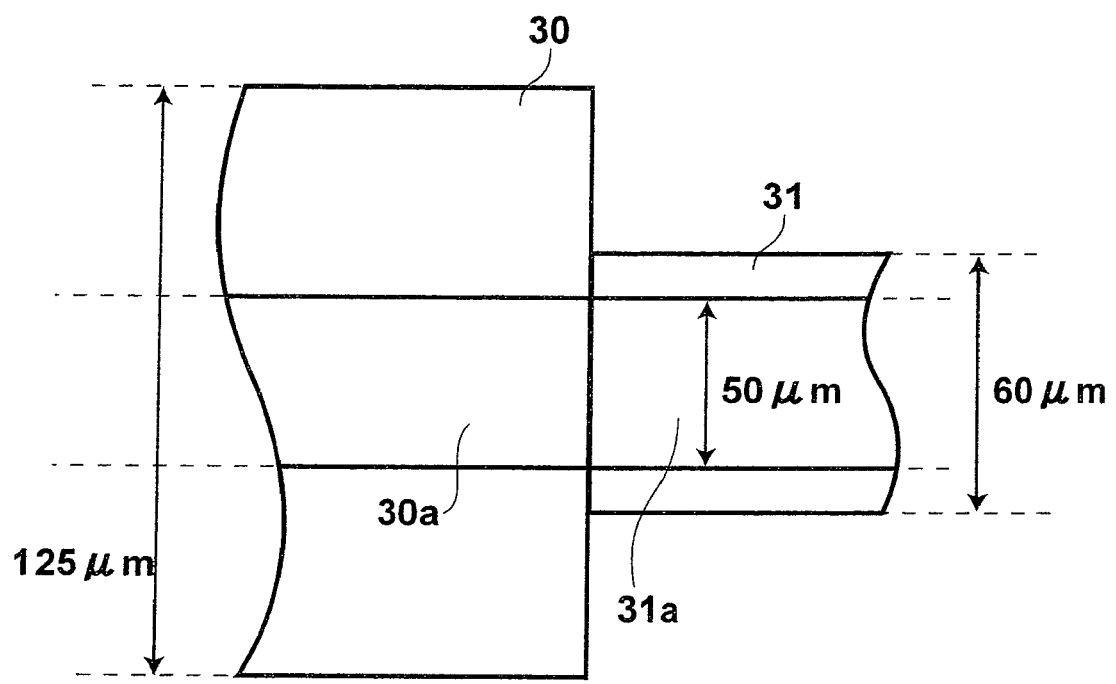
FIG. 10 is a diagram that illustrates the configuration of multi mode optical fibers.

In the present embodiment, the optical fiber 31 having a small cladding diameter and a length of approximately 1 to 30 cm is coaxially coupled to the light emitting end of the multi mode optical fiber 30 having a large cladding diameter, as illustrated in FIG. 10. Each pair of the optical fibers 30 and 31 are coupled by fusing the light incident end surface of the optical fiber 31 with the light emitting end surface of the multi mode optical fiber 30 such that the core axes thereof are matched. As described above, the diameter of the core 31a of the optical fiber 31 is the same as the diameter of the core 30a of the multi mode optical fiber 30.

Step index type optical fibers, graded index type optical fibers, or combined type optical fibers may be employed as the multi mode optical fibers 30 and the optical fibers 31. Step index type optical fibers produced by Mitsubishi Wire Industries KK may be employed, for example. In the present embodiment, the multi mode optical fibers 30 and the optical fibers 31 are step index type optical fibers. The multi mode optical fiber 30 has a cladding diameter of 125 µm, a core diameter of 50 µm, and an NA of 0.2. The optical fiber 31 has a cladding diameter of 60 µm, a core diameter of 50 µm, and an NA of 0.2. The transmissivity of the coating at the light incident end surface of the multi mode optical fiber 30 is 99.5% or greater.

The cladding diameter of the optical fiber 31 is not limited to being 60 µm. The cladding diameters of many optical fibers, which are utilized in conventional fiber light sources, are 125 µm. However, the focal depth becomes deeper as the cladding diameter decreases. Therefore, it is preferable for the cladding layer of a multi mode optical fiber to be 80 µm or less, and more preferably, 60 µm or less. Meanwhile, in the case of a single mode optical fiber, it is necessary for the core diameter to be at least 3 to 4 µm. Therefore, it is preferable for the cladding diameter of the optical fiber 31 to be 10 µm or greater. It is preferable for the core diameter of the multi mode optical fiber 30 and the core diameter of the optical fiber 31 to be matched, from the viewpoint of coupling efficiency.

Note that it is not necessary to employ two types of optical fibers 30 and 31 having different diameters by fusing them together (so-called "cross diameter fusion"). Alternatively, the fiber array light source may be constituted by bundling a plurality of optical fibers having the same cladding diameter (in the example of FIG. 9A, the optical fibers 30).

Figure 11:
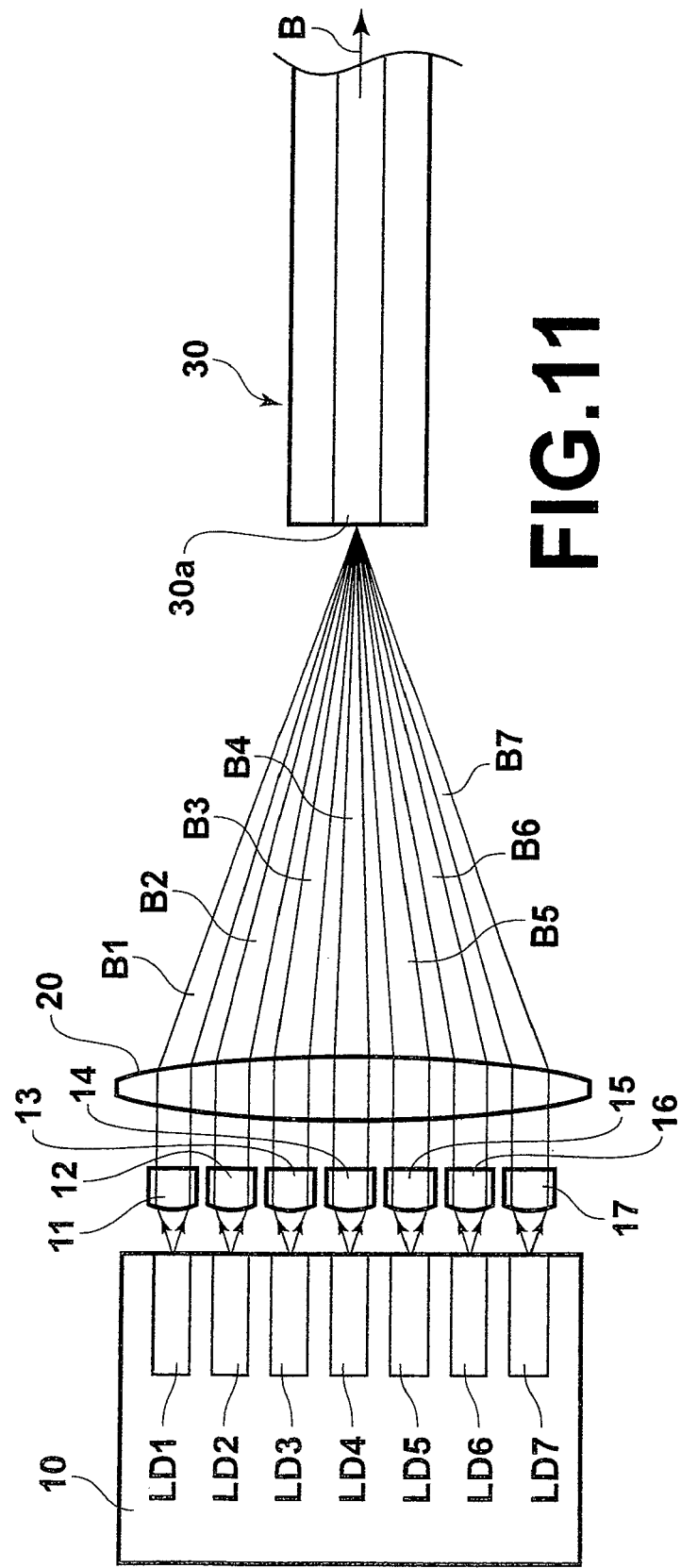
FIG. 11 is a plan view that illustrates the construction of a multiplex laser light source.

Each of the laser modules 64 is constituted by the multiplex laser light source (fiber light source) illustrated in FIG. 11. The multiplex laser light source comprises: a heat block 10; a plurality (seven, for example) GaN type semiconductor laser chips LD1, LD2, LD3, LD4, LD5, LD6, and LD7, which are aligned and fixed on the heat block 10; collimating lenses 11, 12, 13, 14, 15, 16, and 17, provided corresponding to each of the GaN type semiconductor lasers LD1 through LD7; a single condensing lens 20; and a single multi mode fiber 30. The GaN type semiconductor laser chips may be transverse multi mode laser chips or single mode laser chips. Note that the number of semiconductor lasers is not limited to 7, and any number of semiconductor lasers may be employed. In addition, a collimating lens array, in which the collimating lenses 11 through 17 are integrated, may be employed instead of the collimating lenses 11 through 17.

All of the GaN type semiconductor lasers LD1 through LD7 have the same oscillating wavelength (405 nm, for example), and the same maximum output (in the case of multi mode lasers, approximately 100 mW, and in the case of single mode lasers, approximately 50 mW). Note that the GaN type semiconductors may have any oscillating wavelengths other than 405 nm, within a wavelength range of 350 nm to 450 nm.

Figure 12:
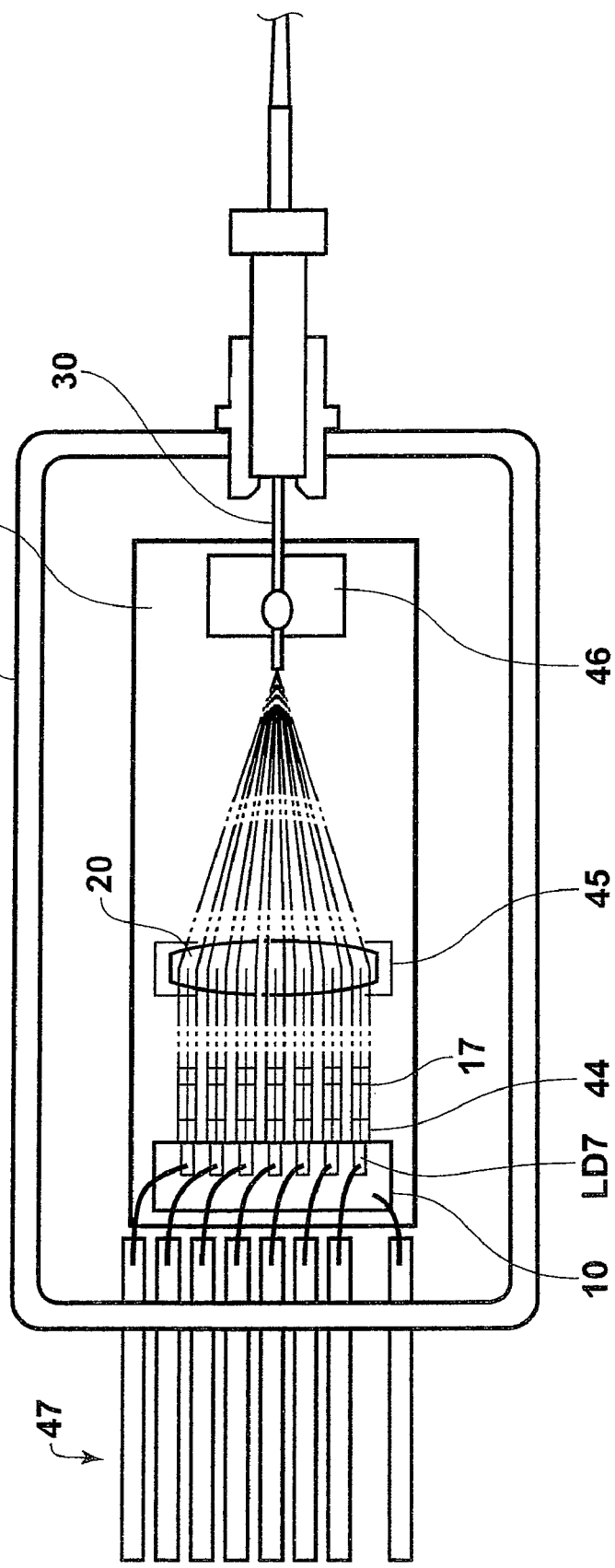
FIG. 12 is a plan view that illustrates the construction of a laser module.
Figure 13:
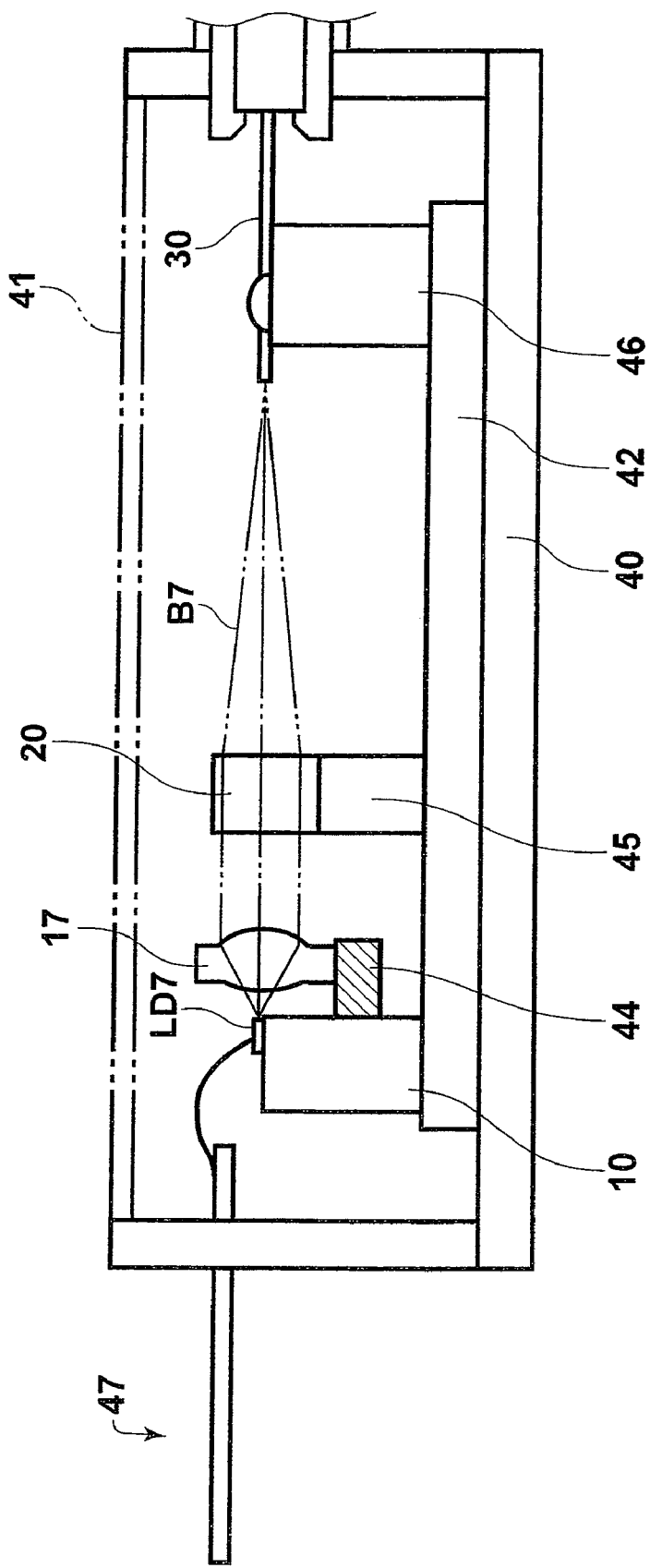
FIG. 13 is a side view of the laser module of FIG. 12.

As illustrated in FIGS. 12 and 13, the multiplex laser light source is housed within a box-shaped package 40 having an open top, along with other optical components. The package 40 is equipped with a package lid 41, formed to seal the open top. The package 40 is deaerated, sealing gas is introduced, and the package lid 41 is placed on the package. Thereby, the multiplex laser light source is hermetically sealed within the closed space (sealed space) of the package 40.

A base plate 42 is fixed on the bottom surface of the package 40. The heat block 10, a condensing lens holder 45 for holding the condensing lens 20, and a fiber holder 46 for holding the light incident end of the multi mode optical fiber 30 are mounted on the base plate 42. The light emitting end of the multi mode optical fiber 30 is pulled out to the exterior of the package 40 through an opening formed in a wall thereof.

A collimating lens holder 44 is mounted on a side surface of the heat block 10, and the collimating lenses 11 through 17 are held thereby. An opening is formed in a side wall of the package 40, and wires 47 for supplying drive current to the GaN type semiconductor lasers LD1 through LD7 are pulled out toward the exterior of the package 40 therethrough.

Note that in FIG. 13, only the GaN type semiconductor laser LD7 and the collimating lens 17 are labeled with reference numbers, in order to avoid complexity in the drawing.

Figure 14:
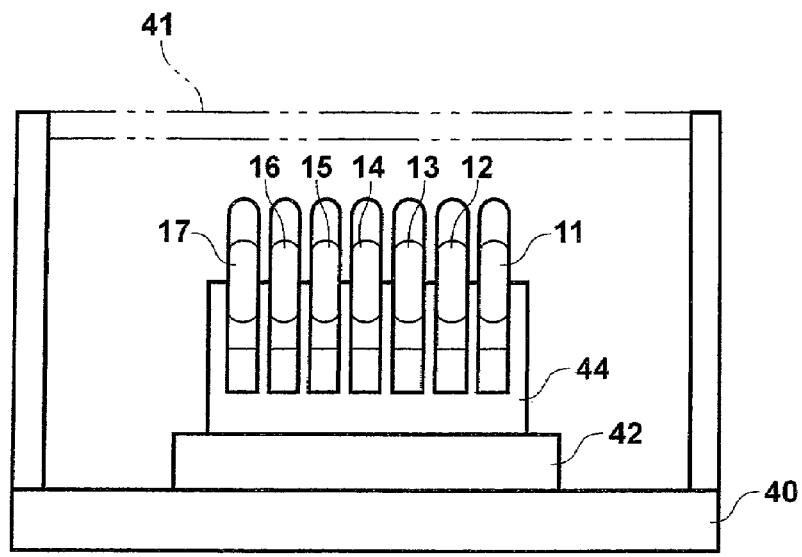
FIG. 14 is a partial front view of the laser module of FIG. 12.

FIG. 14 is a front view of the mounting portions of the collimating lenses 11 through 17. Each of the collimating lenses 11 through 17 is formed to be of an elongate shape, obtained by cutting out a region that includes the optical axis of a circular lens having an aspherical surface. The elongate collimating lenses may be formed by molding resin or optical glass, for example. The collimating lenses 11 through 17 are densely provided and such that their longitudinal directions are perpendicular to the arrangement direction of the light emitting points of the GaN type semiconductor lasers LD1 through LD7 (the horizontal direction in FIG. 14).

The GaN type semiconductor lasers LD1 through LD7 comprise active layers having light emitting widths of 2 μm. Laser beams B1 through B7 having beam spread angles of 10 degrees and 30 degrees in the direction parallel to the active layer and the direction perpendicular to the active layer, respectively, are emitted from the GaN type semiconductor lasers LD1 through LD7. The GaN type semiconductor lasers LD1 through LD7 are provided such that the light emitting points thereof are aligned in a direction parallel to the active layers thereof.

Accordingly, the laser beams B1 through B7 are emitted from each of the light emitting points such that they enter the collimating lenses 11 through 17 in a state in which the directions that their beam spread angles are greater match the lengthwise directions of the collimating lenses 11 through 17, and in which the directions that their beam spread angles are smaller match the width directions of the collimating lenses 11 through 17. The widths and lengths of each of the collimating lenses 11 through 17 are 1.1 mm and 4.6 mm, respectively. The beam diameters of the laser beams B1 through B7 in the horizontal direction and the vertical direction are 0.9 mm and 2.6 mm, respectively. The collimating lenses 11 through 17 have focal distances $f_1$ of 3 mm, numerical apertures NA of 0.6, and are arranged at a pitch of 1.25 mm.

The condensing lens 20 is obtained by cutting out an elongate region that includes the optical axis of a circular lens having an aspherical surface at parallel planes. The condensing lens 20 is formed such that it is long in the arrangement direction of the collimating lenses 11 through 17, that is, the horizontal direction, and short in the direction perpendicular to the arrangement direction. The condensing lens 20 has a focal distance $f_2$ of 23 mm, and a numerical aperture NA of 0.2. The condensing lens 20 may also be formed by molding resin or optical glass, for example.

Figure 5:
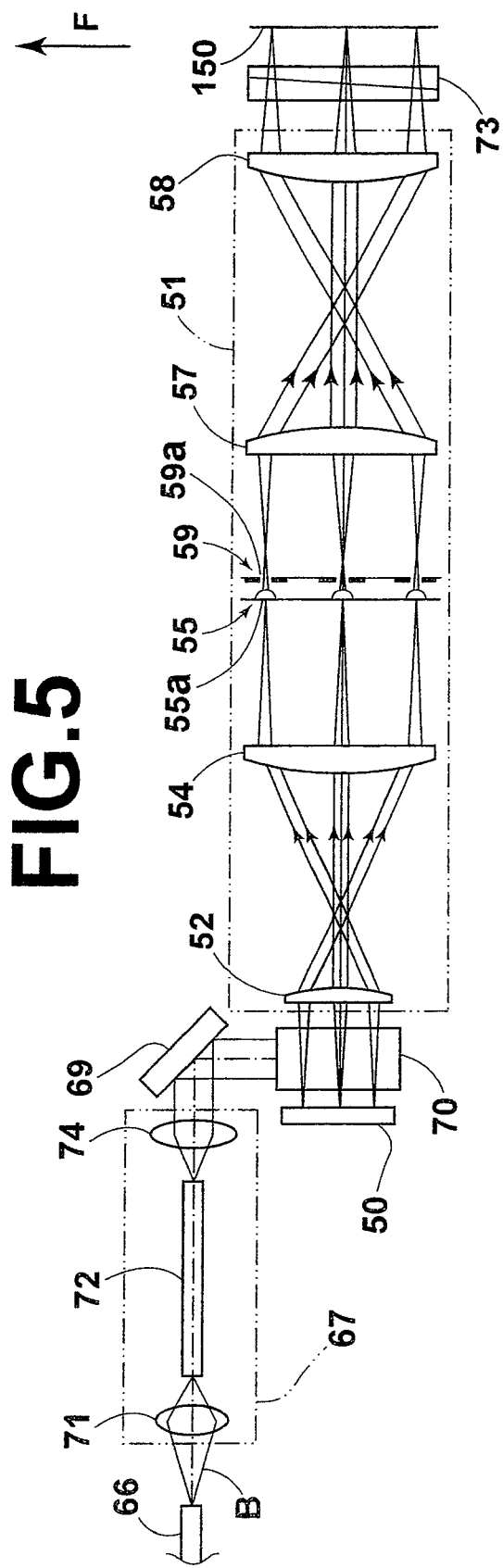
FIG. 5 is a schematic sectional view that illustrates the exposure head of the image exposure apparatus according to the first embodiment of the present invention.

The micro lens array 55 illustrated in FIG. 5 is constituted by a great number of micro lenses 55a, which are arranged two dimensionally, corresponding to each pixel of the DMD 50. In the present embodiment, only 1024×256 columns out of 1024×768 columns of micro mirrors of the DMD 50 are driven, as will be described later. Therefore, 1024×256 columns of micro lenses 55a are provided, corresponding thereto. The arrangement pitch of the micro lenses 55a is 41 μm in both the vertical and horizontal directions. The micro lenses 55a are formed by optical glass BK7, and have focal distances of 0.19 mm and NA's (Numerical Apertures) of 0.11, for example.

The aperture array 59 has a great number of apertures 59a formed therethrough, corresponding to the micro lenses 55a of the micro lens array 55. In the present embodiment, the diameter of the apertures 59a is 10 μm.

The first focusing optical system magnifies the images that propagate thereto from the DMD 50 by 3× and focuses the images on the micro lens array 55. The second focusing optical system magnifies the images that have passed through the micro lens array 55 by 1.6×, and focuses the images onto the photosensitive material 150. Accordingly, the images from the DMD 50 are magnified at 4.8× magnification and projected onto the photosensitive material 150.

Note that in the present embodiment, a prism pair 73 is provided between the second focusing optical system and the photosensitive material 150. The focus of the image on the photosensitive material 150 is adjustable, by moving the prism pair 73 in the vertical direction in FIG. 5. Note that in FIG. 5, the photosensitive material 150 is conveyed in the direction of arrow F to perform sub-scanning.

Figure 15:
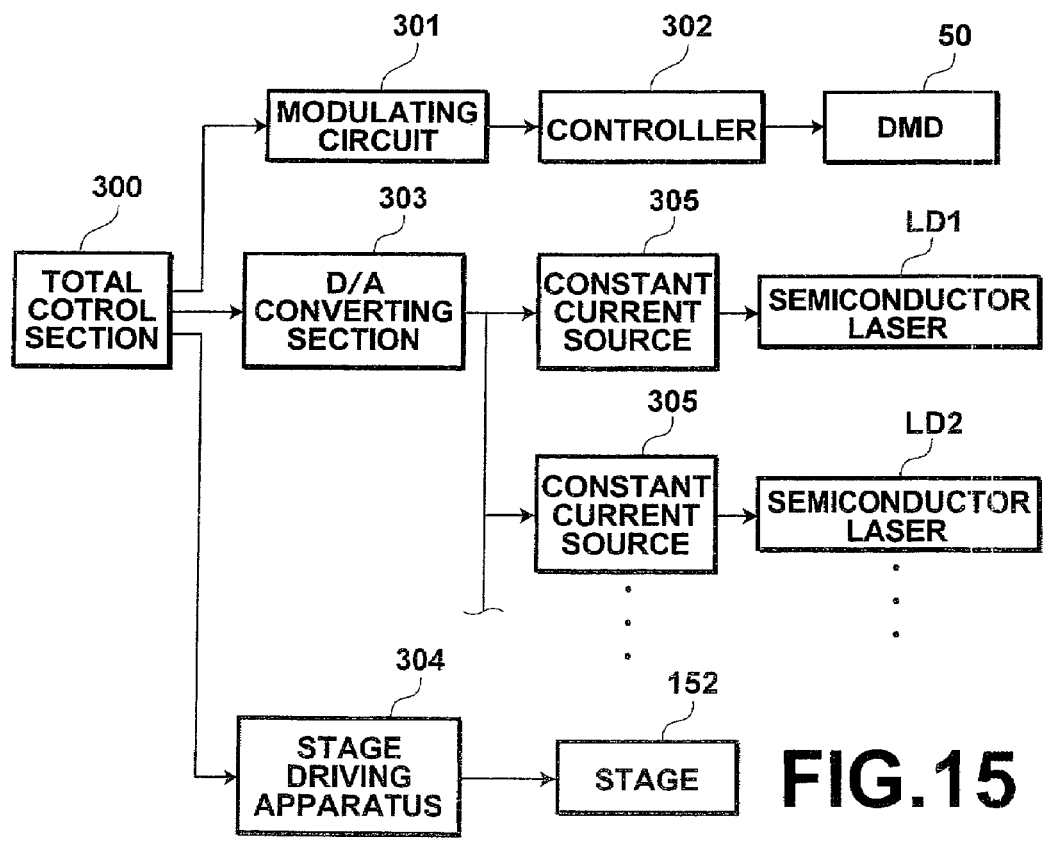
FIG. 15 is a block diagram that illustrates the electrical configuration of the image exposure apparatus according to the first embodiment of the present invention.

Next, the electrical configuration of the image exposure apparatus of the present embodiment will be described with reference to FIG. 15. As illustrated in FIG. 15, a total control section 300 is connected to a modulating circuit 301, which in turn is connected to the controller 302 for controlling the DMD's 50. The total control section 300 is also connected to seven constant current sources 305, for driving each of the GaN type semiconductor lasers LD1 through LD7 of the laser modules 64, via a D/A converting section 303. Further, the total control section 300 is connected to the stage driving apparatus 304, for driving the stage 152.

[Operation of the Image Exposure Apparatus]

Next, the operation of the image exposure apparatus described above will be described. The laser beams B1 through B7 are emitted by each of the GaN type semiconductor lasers LD1 through LD7 (refer to FIG. 11) that constitute the multiplex laser light source of the fiber array light source 66 in a diffuse state. The laser beams B1 through B7 are collimated by the collimating lens corresponding thereto, from among the collimating lenses 11 through 17. The collimated laser beams B1 through B7 are condensed by the condensing lens 20, and are converged onto the light incident surface of the core 30a of the multi mode optical fiber 30.

In the present embodiment, the collimating lenses 11 through 17 and the condensing lens 20 constitute a condensing optical system, and the condensing optical system and the multi mode optical fiber 30 constitute a multiplex optical system. That is, the laser beams B1 through B7, which have been condensed by the condensing lens 20 enter the core 30a of the multi mode optical fiber 30, are multiplexed into a single laser beam B, and emitted from the optical fiber 31, which is coupled to the light emitting end of the multi mode optical fiber 30.

The coupling efficiency of the laser beams B1 through B7 with respect to the multi mode optical fiber 30 is 0.9 in each of the laser modules. In the case that the output of each of the GaN type semiconductor lasers LD1 through LD7 is 50 mW, a multiplexed laser beam B having an output of 315 mW (50 mW×0.9×7) can be obtained from each of the optical fibers 31 which are provided in the array. Accordingly, a laser beam B having an output of 4.4 W (0.315 W×14) can be obtained from the 14 combined optical fibers 31.

During image exposure, image data corresponding to an exposure pattern is input to the controller 302 of the DMD's 50 from the modulating circuit 301. The image data is temporarily stored in a frame memory of the controller 302. The image data represents the density of each pixel that constitutes an image as binary data (dot to be recorded/dot not to be recorded).

The stage 152, on the surface of which the photosensitive material 150 is fixed by suction, is conveyed along the guides 158 from the upstream side to the downstream side of the gate 160 by the stage driving apparatus 304 illustrated in FIG. 15. When the stage 152 passes under the gate 160, the leading edge of the photosensitive material is detected by the sensors 164, which are mounted on the gate 160. Then, the image data recorded in the frame memory is sequentially read out a plurality of lines at a time. Control signals are generated by the signal processing section for each exposure head 166, based on the read out image data. Thereafter, the mirror driving control section controls the ON/OFF states of each micro mirror of the DMD's 50 of each exposure head, based on the generated control signals. Note that in the present embodiment, the size of each micro mirror that corresponds to a single pixel is 14 μm×14 μm.

When the laser beam B is irradiated onto the DMD's 50 from the fiber array light source 66, laser beams which are reflected by micro mirrors in the ON state are focused on the photosensitive material 150 by the lens systems 54 and 58. The laser beams emitted from the fiber array light source 66 are turned ON/OFF for each pixel, and the photosensitive material 150 is exposed in pixel units (exposure areas 168) substantially equal to the number of pixels of the DMD's 50 in this manner. The photosensitive material 150 is conveyed with the stage 152 at the constant speed. Sub-scanning is performed in the direction opposite the stage moving direction by the scanner 162, and band-shaped exposed regions 170 are formed on the photosensitive material 150 by each exposure head 166.

Figure 16A:
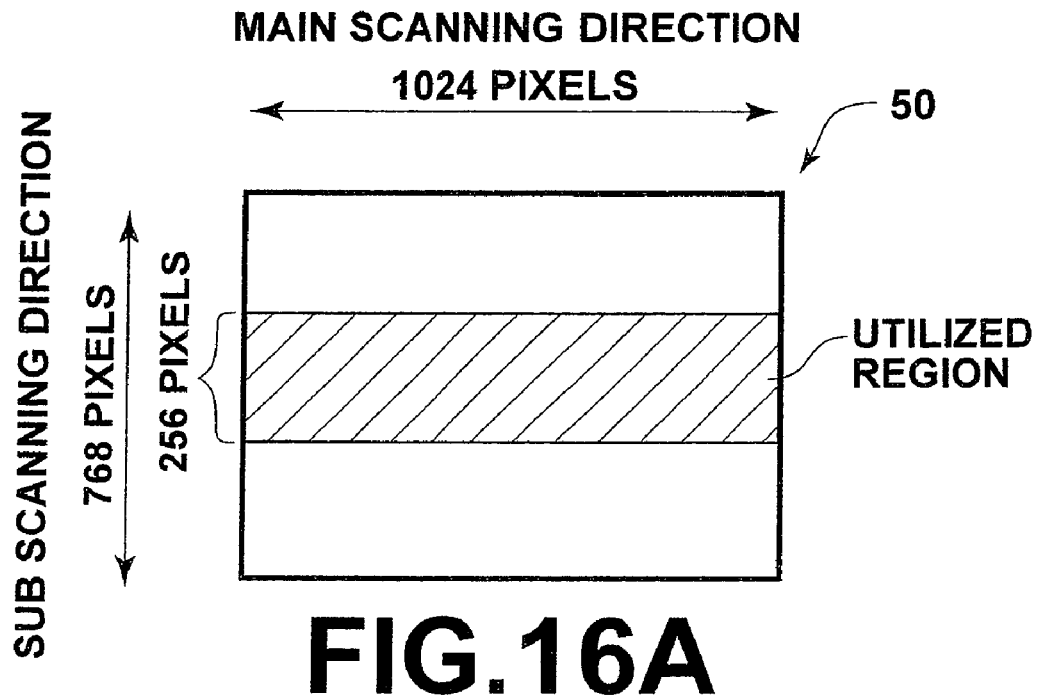
FIG. 16A is a diagram that illustrates an example of a utilized region of the DMD.
Figure 16B:
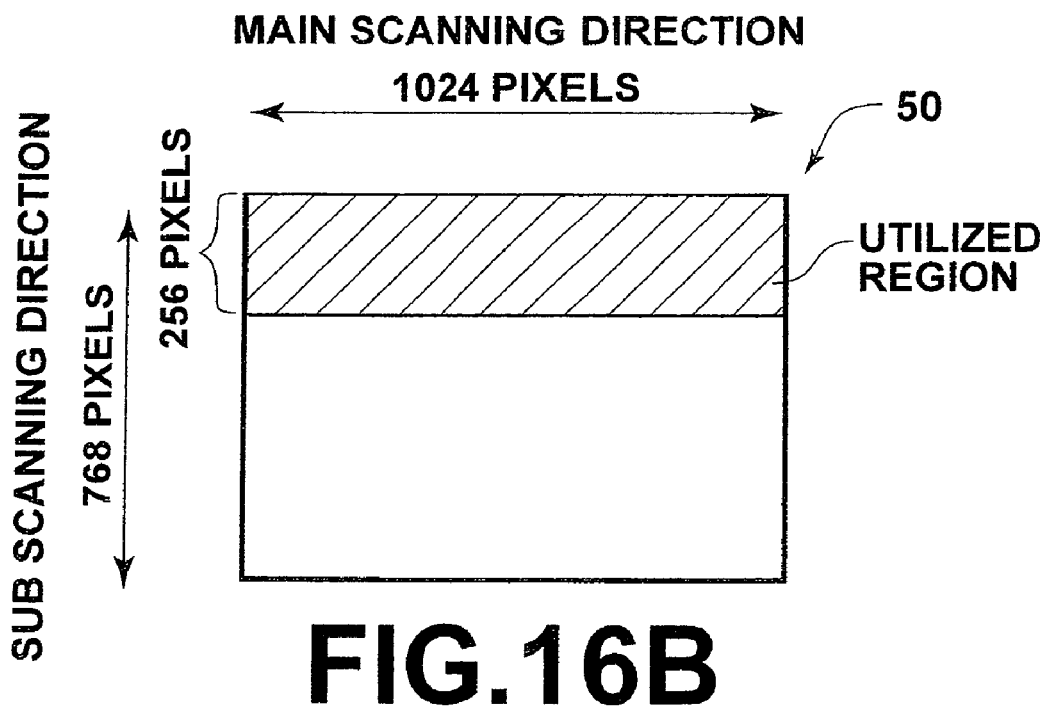
FIG. 16B is a diagram that illustrates an example of a utilized region of the DMD.

Note that in the present embodiment, 768 columns of micro mirror rows having 1024 micro mirrors therein are provided on each DMD 50 in the sub scanning direction, as illustrated in FIGS. 16A and 16B. However, only a portion of the micro mirror columns (256 columns of 1024 micro mirrors, for example) is driven by the controller 302.

In this case, the micro mirror columns situated at the central portion of the DMD 50 may be utilized, as illustrated in FIG. 16A. Alternatively, the micro mirror columns situated at the edge of the DMD 50 may be utilized, as illustrated in FIG. 16B. In addition, the micro mirror columns to be utilized may be changed as appropriate, in cases that defects occur in a portion of the micro mirrors and the like.

The data processing speed of the DMD's 50 is limited, and the modulation speed for each line is determined proportionate to the number of utilized pixels. Therefore, the modulation speed is increased by utilizing only a portion of the micro mirror columns. Meanwhile, in the case that an exposure method is adopted in which the exposure heads are continuously moved with respect to the exposure surface, it is not necessary to utilize all of the pixels in the sub scanning direction.

When sub scanning of the photosensitive material 150 by the scanner 162 is completed and the trailing edge of the photosensitive material 150 is detected by the sensors 162, the stage 152 is returned to its starting point at the most upstream side of the gate 160 along the guides 152 by the stage driving apparatus 304. Then, the stage 152 is moved from the upstream side to the downstream side of the gate 160 at the constant speed again.

[Details of the Optical Systems of the Image Exposure Apparatus]

Next, an illuminating optical system for irradiating the laser beam B onto the DMD's 50, comprising: the fiber array 66, the condensing lens 71, the rod integrator 72, the collimating lens 74, the mirror 69, and the TIR prism 70 illustrated in FIG. 5 will be described. The rod integrator 72 is a light transmissive rod, formed as a square column, for example. The laser beam B propagates through the interior of the rod integrator 72 while being totally reflected therein, and the intensity distribution within the cross section of the laser beam B is uniformized. Note that an anti-reflective film is coated on the light incident surface and the light emitting surface of the rod integrator 72, to increase the transmissivity thereof. By uniformizing the intensity distribution within the cross section of the laser beam B in this manner, unevenness in the intensity of the illuminating light can be eliminated, and highly detailed images can be exposed on the photosensitive material 150.

Next, the method for driving the GaN type semiconductor lasers LD1 through LD7 (refer to FIG. 11) that constitute the laser module 64 will be described in detail with reference to FIG. 15. The total control section 300 illustrated in FIG. 15 is constituted by a PC (Personal Computer) or the like. Memory means, such as a ROM (Read Only Memory) within the PC, has a pattern that changes the drive current values for the GaN type semiconductor lasers LD1 through LD7 according to the amount of time which has passed since initiating driving thereof recorded therein. The pattern is recorded as a plurality of parameters corresponding to the amount of time which has passed since initiating driving of the GaN type semiconductor lasers LD1 through LD7. As illustrated in the example of Table 1 below, the parameters are expressed in current ratios "$I_{rate}$", for periods of time T which have passed from drive initiation.

TABLE 1

| T (seconds) | $I_{rate}$ |
|---|---|
| 0.0 | 0.994 |
| 0.9 | 0.995 |
| 1.4 | 0.996 |
| 2.4 | 0.997 |
| 4.6 | 0.998 |
| 8.0 | 0.999 |
| 14.0 | 1 |

Figure 17:
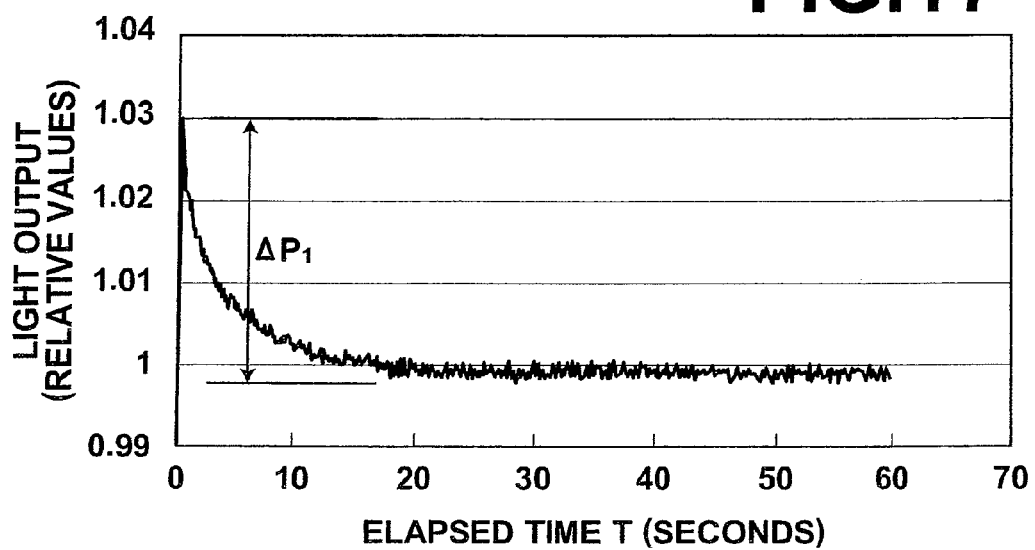
FIG. 17 is a graph that illustrates light output fluctuation properties of a semiconductor laser driven by a conventional method.

Here, if the semiconductors are driven by the conventional ACC drive method, the light outputs thereof will fluctuate over time T, as illustrated in FIG. 17. Generally, light output gradually decreases over approximately 20 seconds from drive initiation until a steady state, in which target light output is obtained. This is because the light emitting efficiency of semiconductor lasers deteriorates due to increases in temperature. Note that in the graphs of FIG. 17 and FIG. 18, the light output (vertical axis) is represented as values relative to 1, which is the light output when the semiconductor lasers are driven in a steady state.

When driving the GaN type semiconductor lasers LD1 through LD7, the total control section 300 reads out the times T and the current ratios $I_{rate}$ from the aforementioned memory means, such as the ROM. Then, the total control section outputs digital data that represents the current ratio $I_{rate}$, which corresponds to the time T that has passed since drive initiation, to the D/A converting section 303. That is, in the case of the example illustrated in Table 1, digital data representing $I_{rate}$=0.994 and $I_{rate}$=0.995 are input to the D/A converting section 303 during the period T 0.0 seconds to 0.9 seconds from drive initiation and during the period T 0.9 seconds to 1.4 seconds from drive initiation, respectively.

The D/A converting section 303 converts the input digital data that represents the current ratios $I_{rate}$ into analog values. The converted analog values are simultaneously output to the constant current sources 305 that drive each of the GaN type semiconductor lasers LD1 through LD7. The seven constant current sources 305 are basically configured to supply constant currents I con that enable obtainment of target light outputs from each of the GaN type semiconductor lasers LD1 through LD7. The constant current I con may be the same among the GaN type semiconductor lasers LD1 through LD7, or they may be different. However, when the analog values that represent the current ratios $I_{rate}$ are input into the constant current sources 305, the constant current sources 305 supply currents of values equal to I con multiplied by the current ratios $I_{rate}$. In the example illustrated in Table 1, the current ratio $I_{rate}$ is 1 from T=14 seconds and thereafter. Therefore, at T=14 seconds and thereafter, the constant current I con is supplied to each of the GaN type semiconductor lasers LD1 through LD7.

Figure 18:
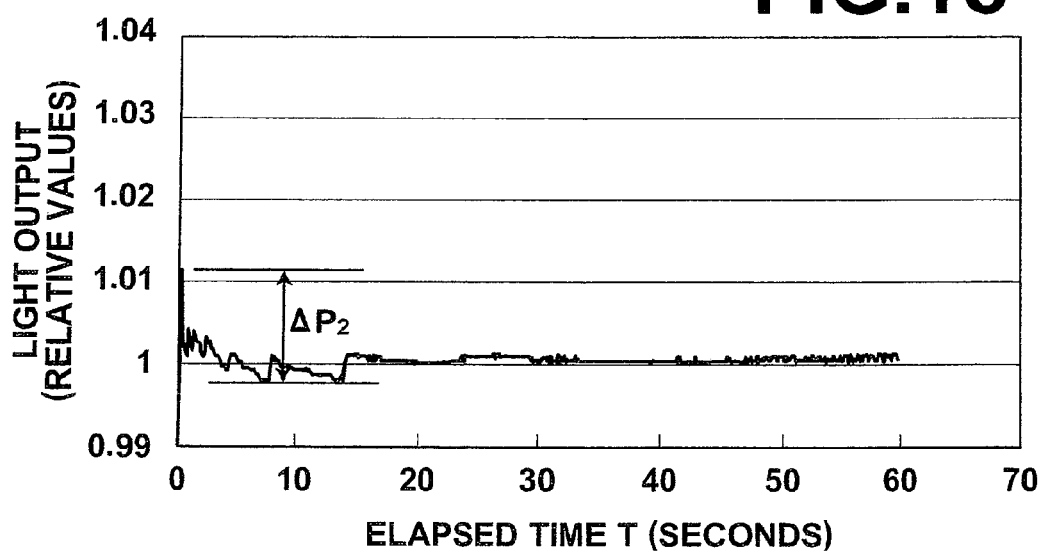
FIG. 18 is a graph that illustrates light output fluctuation properties of a semiconductor laser driven by the method of the present invention.

Thereby, the light output changes in a stepwise manner, as illustrated in the example of FIG. 18. When compared against the light output of the conventional method as illustrated in FIG. 17, the constant target light output is approached in a shorter amount of time, and the range of fluctuation $\Delta P_2$ of the light output is smaller than the range of fluctuation $\Delta P_1$ of the conventional method. Thereby, high output laser beams B1 through B7 (that is, the multiplexed laser beam B) can be stably obtained without a long start up time. In addition, the structure for driving semiconductor lasers in this manner can be produced by slightly modifying the total control section 300. Accordingly, the exposure apparatus realizes the method simply and at low cost.

Note that during the period of time that semiconductor lasers LD1 through LD7 are driven in a steady state after applying the method for driving semiconductor lasers of the present invention, either the ACC drive method or the APC method may be utilized. In the case that the constant current sources 305 drive the GaN type semiconductor lasers LD1 through LD7 throughout the entire period that they are driven as in the present embodiment, the structure of the driving apparatus can be simplified. In addition, it is not necessary to split the laser beam B, which is to be utilized, in order to monitor the light output. Therefore, the utilization efficiency of the laser beam B is increased. Further, photodetectors and feedback loop circuits for monitoring the light output become unnecessary, which will decrease the cost of the exposure apparatus.

In the present embodiment, a single pattern, that is, a single set of parameters, for varying the drive currents of the GaN type semiconductor lasers LD1 through LD7 in stepwise increments is employed in common to drive the 7 GaN type semiconductor lasers LD1 through LD7. Therefore, a small capacity memory means may be employed to record the pattern therein.

In the case that it is desired to stabilize the light output more accurately, parameters may be set at predetermined time intervals, for example, every 0.1 seconds, from immediately after the GaN type semiconductor lasers LD1 through LD7 are turned ON, until immediately before they are turned OFF.

In the present embodiment, the parameters are the current ratios $I_{rate}$. Therefore, the parameters may be employed in common to drive the plurality of GaN type semiconductor lasers LD1 through LD7 to achieve stable output therefrom, even if the drive current/light output properties thereof differ. In contrast, in the case that drive current values themselves are employed as the parameters, it becomes necessary to define a pattern for each of the GaN type semiconductor lasers LD1 through LD7 in the case that the drive current/light output properties thereof differ. This would necessitate a large capacity memory means to record a great number of parameters therein. Further, in the case that the great number of parameters are utilized, a long amount of time would be required to process the patterns, and the configuration of a processing apparatus will become complex.

In the present embodiment, the process of varying the drive current in stepwise increments is performed with a common timing for the plurality of GaN type semiconductor lasers LD1 through LD7. Therefore, only a single total control section 300 and D/A converting section 303 (refer to FIG. 15) as current control means is necessary, which enables manufacture of the driving apparatus at low cost.

Note that in the present embodiment, the seven GaN type semiconductor lasers LD1 through LD7 are commonly driven by a single set of parameters. Alternatively, four of the seven GaN type semiconductor lasers LD1 through LD7 may be driven according to one set of parameters, while the remaining three may be driven according to another set of parameters. In this case as well, the same effects as those obtained when the plurality of semiconductor lasers are driven by a single set of parameters can be obtained.

Fourteen laser modules 64 are employed in the present embodiment. Therefore, if the GaN type semiconductor lasers LD1 through LD7 of each module 64 are driven by a different set of parameters, a total of fourteen sets of parameters become necessary. Alternatively, several of the fourteen modules 64 may be driven by a single common set of parameters. In this case, the necessary number of sets of parameters can be less than fourteen.

In the present embodiment, the method for driving semiconductor lasers of the present invention is applied to drive the GaN type semiconductor lasers LD1 through LD7 of the exposure apparatus comprising: the GaN type semiconductor lasers LD1 through LD7; and the optical fibers 30, into which the laser beams B1 through B7 emitted by each of the plurality of GaN type semiconductor lasers LD1 through LD7 enter to be multiplexed thereby. Therefore, it can be said that the stabilization effect of light output is particularly conspicuous.

That is, in the above structure, there are cases in which the output of the multiplexed laser beam B fluctuates, not only due to differences in the drive current/light output properties of the GaN type semiconductor lasers LD1 through LD7 that are driven, but also due to the heat generated thereby. The fluctuations are caused by thermal expansion of structural members of the modules 64 due to the generated heat. The thermal expansion shifts the laser beams B1 through B7 and the optical fibers 30 from their coaxial states, thereby changing the input efficiencies of the laser beams B1 through B7 with respect to the optical fibers 30. Further, there are cases in which the beam profiles of the laser beams B1 through B7 fluctuate during the period from drive initiation to a steady driving state. The input efficiencies of the laser beams with respect to the optical fibers 30 may change in these cases as well. For example, in the structure illustrated in FIGS. 11 through 13, approximately eight seconds are required from drive initiation of the lasers until the fluctuations in light output of the multiplexed laser beam B stabilizes to ±5% or less.

However, if the aforementioned parameters are generated by detecting the laser beam B emitted from the optical fiber 30, parameters that reflect the changes in input efficiencies can be obtained. Therefore, fluctuations in light output caused by the changes in input efficiencies can also be corrected.

In the present embodiment, the method for driving semiconductor lasers of the present invention is applied to drive the GaN type semiconductor lasers LD1 through LD7 which are commonly fixed on the single heat block 10, which functions as a heat sink. Based on this point as well, the method is particularly effective in stabilizing light output. That is, in this configuration, the properties of each of the GaN type semiconductor lasers LD1 through LD7 may change due to synergistic heat generated thereby. Even in this case, if the aforementioned parameters are generated by detecting the multiplexed laser beam B, parameters that reflect the effects of the synergistic heat can be obtained. Therefore, fluctuations in light output of the laser beam B caused by synergistic heating of the GaN type semiconductor lasers LD1 through LD7 can also be corrected.

Figure 21:
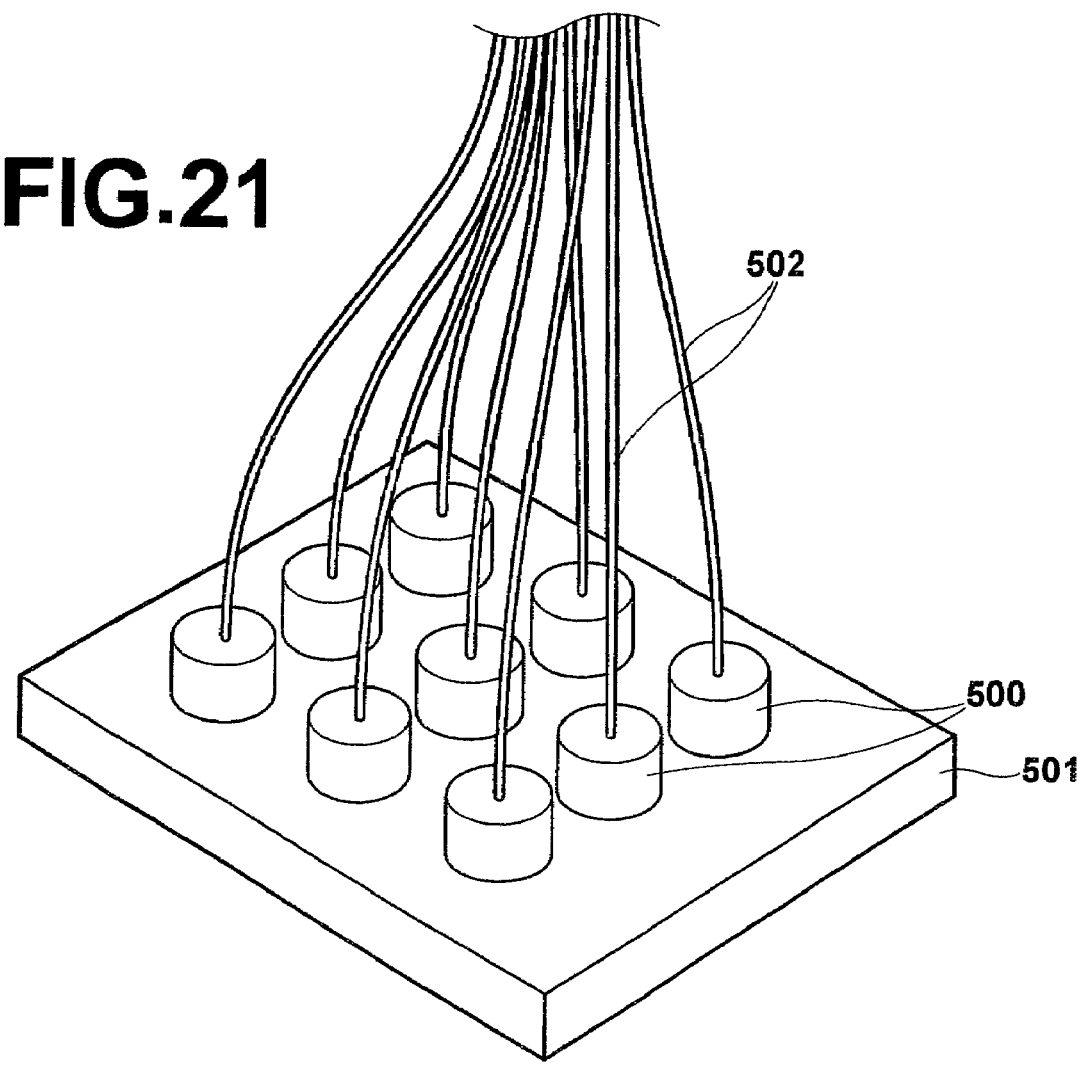
FIG. 21 is a perspective view that illustrates another laser apparatus to which the driving method of the present invention is applied.

The aforementioned effects are not limited to being obtained in a laser module such as that illustrated in FIGS. 11 through 13. The same effects can be obtained in a structure in which a plurality of semiconductor lasers 500, constituted by semiconductor laser chips housed in a Can type package, are fixed onto a common heat sink 501, as illustrated in FIG. 21. Note that in this structure, each laser beam emitted by each of the semiconductor laser 500 is led to positions at which they are used by an optical fiber 502.

The aforementioned effects can be obtained both in the case that the temperatures of the plurality of semiconductor lasers are adjusted via the heat block 10 or the heat sink 501, and in the case that temperature adjustment is not performed.

In the present embodiment, the method for driving semiconductor lasers of the present invention is applied to drive the plurality of GaN type semiconductor lasers LD1 through LD7. Therefore, the method is particularly effective in stabilizing light output of the semiconductor lasers. GaN type semiconductor lasers generate more heat in comparison with other types of semiconductor lasers, such as GaAs type semiconductor lasers. Therefore, the drive current/light output properties thereof fluctuate conspicuously during a period of time from drive initiation to a steady driving state. However, by applying the method for driving semiconductor lasers of the present invention, the fluctuations in the drive current/light output properties of GaN type semiconductor lasers can be corrected, thereby enabling stabilization of output of the laser beams B1 through B7.

In addition, the GaN type semiconductor lasers LD1 through LD7 have the characteristic that only the oscillation threshold current thereof changes in response to temperature changes, at or near room temperature. That is, the slope efficiency thereof does not change greatly in response to temperature changes at or near room temperature. Therefore, parameters, which are determined for an arbitrary current range, can be utilized within substantially all output ranges. That is, the parameters do not need to be changed according to changes in output. This point is not solely true for GaN type semiconductor lasers, but is also true for other semiconductor lasers, for which a temperature characteristic coefficient $T_1$ of the slope efficiency is small with respect to a temperature characteristic coefficient $T_0$ of the oscillation threshold current.

Note that the coefficient $T_0$ is a coefficient that represents temperature characteristics of an oscillation threshold current $I_{th}$ in an IL waveform (drive current/light output property) of a semiconductor laser. The coefficient $T_1$ is a coefficient that represents the temperature property of a slope efficiency $\eta_d$ of a semiconductor laser. If the IL wave form has an oscillation threshold current $I_{tha}$ and a slope efficiency $\eta_{da}$ at a temperature $T_a$ and an oscillation threshold current $I_{thb}$ and a slope efficiency $\eta_{db}$ at a temperature $T_b$, $T_0$ and $T_1$ can be defined by the following formulas:

$$T_0 = \frac{T_a - T_b}{ln(I\eta_{tha}/I\eta_{thb})}$$

$$T_1 = \frac{T_a - T_b}{ln(I\eta_{da}/I\eta_{db})}$$

Figure 19:
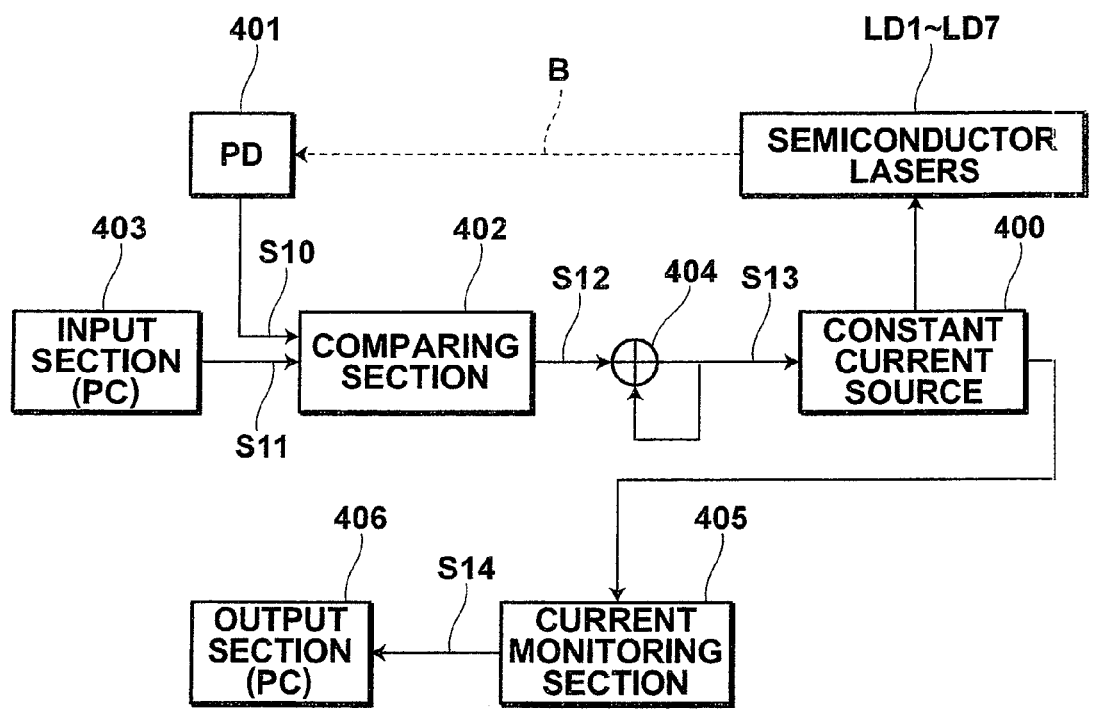
FIG. 19 is a block diagram that illustrates the schematic structure of an apparatus for deriving drive current patterns for semiconductor lasers according to an embodiment of the present invention.

Next, the method for deriving the aforementioned parameters, that is, the current ratios $I_{rate}$ at each time T, will be described. FIG. 19 illustrates the schematic structure of an apparatus for deriving the parameters. As illustrated in FIG. 19, the apparatus comprises: a constant current source 400, for commonly driving seven LDs; a photodetector 401, for detecting the light output of a laser beam B, which is obtained by multiplexing laser beams emitted by the LDs within the optical fiber 30; a comparing section 402, for receiving signals S10 output by the photodetector 401; an input section 403, for inputting light output setting signals S11 into the comparing section 402; an adding section 404, for receiving signals S12 output by the comparing section 402; a current monitoring section 405, for monitoring the current values that the constant current source 400 supplies to the LDs; and an output section 406, for receiving signals S14 output by the current monitoring section 405. Note that the input section 403 and the output section 406 may be constituted by PC's or the like. Note that the photodetector 401 is provided at a position where it is not influenced by the heat generated by the LDs, in order to avoid thermally induced changes in the properties thereof.

Hereinafter, the method for deriving the parameters by the apparatus will be described. This method is executed prior to the exposure operations of the exposure apparatus. First, the constant current source 400 drives all of the LDs with a predetermined current, which is supplied in parallel. At this time, the predetermined current is specified by an initial value of a drive current setting signal S13 output by the adding section 404. This current is of a value that enables obtainment of the steady light output desired during image exposure by the LDs.

Laser beams B1 through B7 are emitted by the LDs driven in this manner. The laser beams B1 through B7 are multiplexed by the multimode optical fiber 30. A portion of the multiplexed laser beam B is split and the light output thereof is detected by the photodetector 401. The signal S10 representing the detected light output is input to the comparing section 402. At the same time, the light output setting signal S11 is input to the comparing section 402 from the input section 403. The light output setting signal S11 represents a light output of the multiplexed light beam B, which is desired during image exposure.

The comparing section 402 outputs a difference signal S12, obtained by the formula: S12=S11−S10. The difference signal 212 is input to the adding section 404. When the difference signal S12 is input, the adding section 404 adds the value of the difference signal S12 to the drive current setting signal S13 that specifies the current to be supplied to the LDs by the constant current source 400. By performing this addition process sequentially at a predetermined frequency, the current supplied to the LDs by the constant current source 400 is sequentially changed to a value such that S11=S10, that is, such that the light output of the multiplexed laser beam B becomes substantially equal to the light output set by the input section 403.

The current supplied by the constant current source that changes in this manner is monitored by the current monitoring section 405. The signal S14, which represents the values of the supplied current, is output to the output section. The changes in the supplied current are changes that have occurred while controlling the light output of the multiplex laser beam B to be equal to the light output set by the input section 403. Therefore, if the drive current of the fucks are changed during image exposure in a manner similar to the pattern of change in the supplied current, the light output of the multiplexed laser bema B becomes the light output value set by the input section 403, or converges at this light output value. Therefore, the output section 406 generates parameters such as those illustrated in Table 1, that is, the current ratios $I_{rate}$ for each amount of passed time T, based on the pattern of change in supplied current represented by the signal S14.

Figure 20:
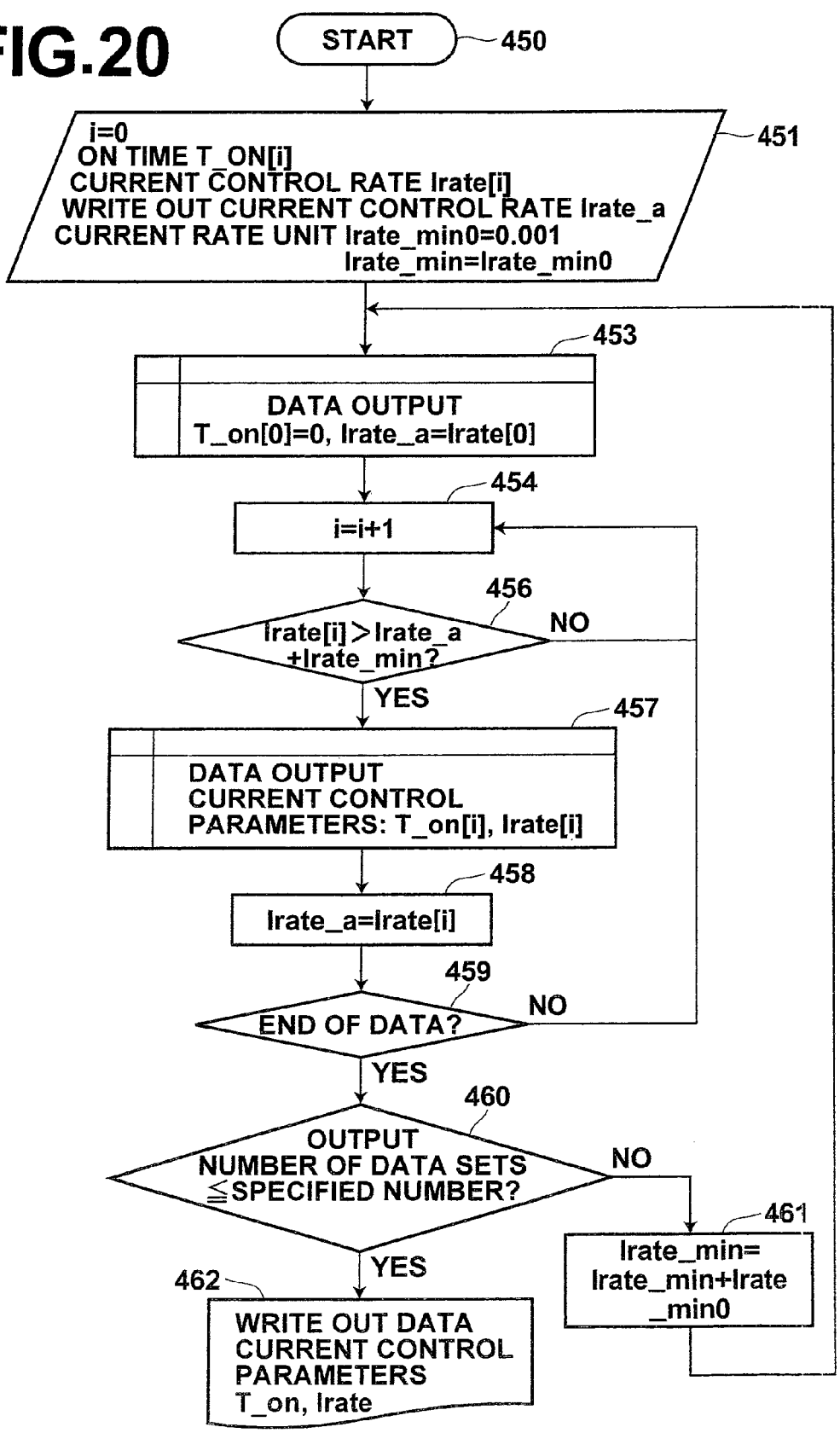
FIG. 20 is a flow chart that illustrates the processes which are performed by the apparatus for deriving drive current patterns for semiconductor lasers according to an embodiment of the present invention.

FIG. 20 is a flow chart that illustrates an example of a parameter generating process that utilizes the signal S14. Hereinafter, this process will be described in detail with reference to FIG. 20. First, the process starts at step 450. Next, at step 451, the ON state time (the amount of time which has passed since drive initiation) T_on[i] within a sampling order i, the current control rate (rate of change in drive current, corresponding to the current ratio during image exposure) $I_{rate}[i]$ within a sampling order i, and a write out current control rate $I_{rate\_a}$ are set. At the same time, a current rate unit $I_{rate\_min}$ that determines the increments of the parameters is set to an initial value $I_{rate\_min0}$, then the initial current rate unit $I_{rate\_min0}$ is set to $I_{rate\_min}$=0.001, and the sampling order i is set to sampling order i=0.

Thereafter, at step 453, a parameter data set that indicates that the ON state time T_on [0]=0 seconds and that the write out current control rate $I_{rate\_a}$ at this time is $I_{rate}[0]$ is output (written out).

Next, at step 454, the sampling order i is increased by 1. Then, at step 456, it is judged whether the current control rate $I_{rate}[i]$ has increased to exceed the current rate unit $I_{rate\_min}$ (at this stage, the current rate unit is $I_{rate\_min0}$, of which the value is 0.001). If this is the case, the process continues to step 457, the current control rate $I_{rate}[i]$ at ON time T_on [i] is output as a parameter data set, and temporarily stored in a memory means. In the case that it is judged that the amount of increase in $I_{rate}[i]$ is less than or equal to the current rate unit $I_{rate\_min}$ in step 456, the process returns to step 454, at which the sampling order i is increased by one, and the judgment of step 456 is performed again.

When the current control rate $I_{rate}[i]$ is output as parameter generating data at step 457, the write out control rate $I_{rate\_a}$ is set to $I_{rate\_a}=I_{rate}[i]$ at step 458. Next, at step 459, it is judged whether input of data (signal S14) is complete. Note that output of the signal S14 by the current monitoring section 405 is controlled such that it is input into the output section 406 for a predetermined amount of time until the fucks are ON in a steady state, or shortly thereafter. The processes of steps 454 through 459 are repeated until it is judged that input of the signal S14 is complete at step 459.

When it is judged that input of the signal S14 is complete at step 459, the process continues to step 460. At step 460, it is judged whether the number of parameter data sets, which have been written out and stored in the memory means, is less than or equal to a specified number. If this is the case, the stored parameter data sets, that is, the current control rates $I_{rate}$ for a plurality of ON times T_on are written in a memory means for output, such as a ROM.

If it is judged that the number of parameter data sets, which have been written out and stored in the memory means, exceeds the specified number, the process continues to step 461. At step 461, the current rate unit $I_{rate\_min}$ is increased by $I_{rate\_min0}$=0.001, and the process returns to step 452. By performing the process in this manner, the current rate unit $I_{rate\_min}$ is prevented from being too small, that is, the increments of the parameters are prevented from being too small, thereby avoiding an unnecessarily great number of parameters.

Generally, the light output stabilizing effect improves, the greater the number of parameters there are. However, if the number of parameters is unnecessarily great, a larger capacity memory becomes necessary to store them, thereby causing systems to become complex. In addition, more time becomes necessary to process the great number of parameters.

Note that it is possible to generate the parameters by methods other that that described above. An example of an alternative method for generating the parameters will be described below. In this case, a plurality of semiconductor lasers are driven at a rated current value, to cause them to emit light at a rated output. The total output at this time is monitored by a photodetector. The amounts of time that have passed from drive initiation are monitored, and fluctuations in light output at these times are monitored and recorded. Next, optimal percentages of drive currents in order to obtain constant output are calculated, based on the measured fluctuations in light output, the average drive current/light output waveform of the type of semiconductor lasers which have been monitored, and coefficients for correcting influence by heat. Thereafter, the calculated percentages with respect to the amounts of time that have passed from drive initiation are designated as the parameters.

Figure 22:
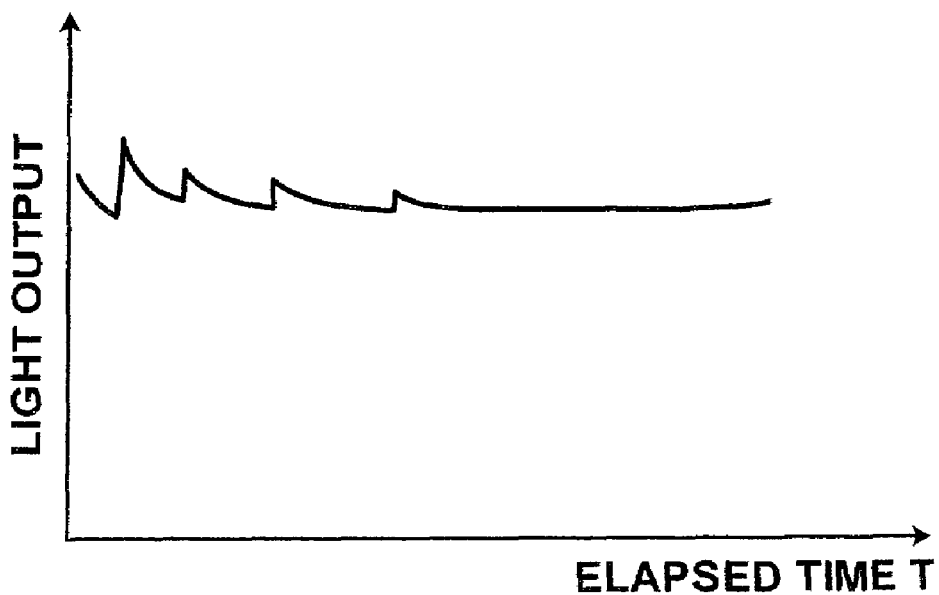
FIG. 22 is a graph that illustrates an example of light output fluctuation properties of a semiconductor laser driven by the method of the present invention.
Figure 23:
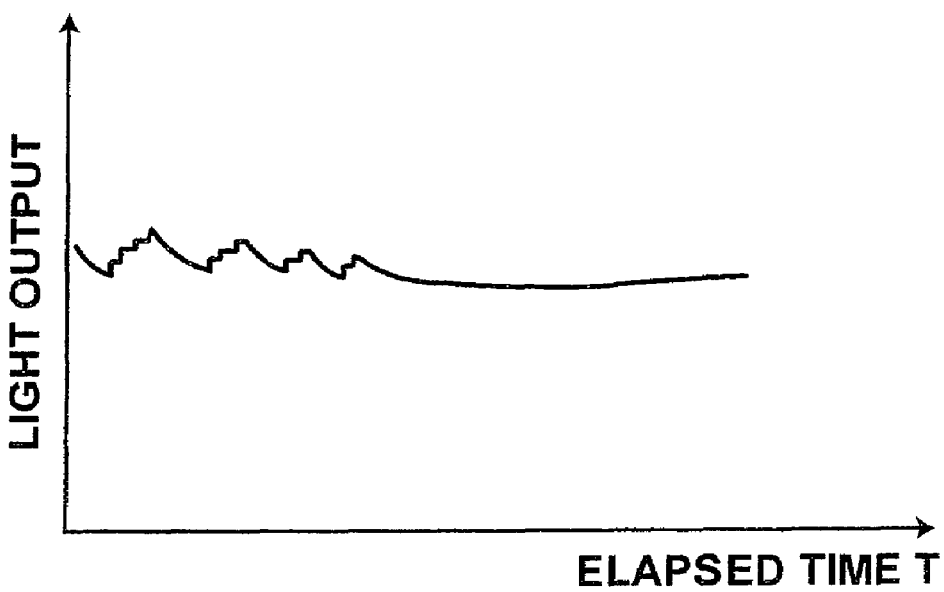
FIG. 23 is a graph that illustrates another example of light output fluctuation properties of a semiconductor laser driven by the method of the present invention.

In the case that laser beams which have been emitted from a plurality of semiconductor lasers are multiplexed in the above embodiment, it is desirable for the process of varying the drive currents of the semiconductor lasers with time lags therebetween. In this case, slight variations in light output among each of the semiconductor lasers prior to multiplexing are canceled, and variations in light output of a multiplexed laser beam can be smoothed. That is, in the case that the light output of a multiplexed laser beam is as that illustrated in FIG. 22 without the time lags, the light output of the multiplexed laser beam can be smoothed to that illustrated in FIG. 23, by providing the time lags.

The embodiment described above is for a case in which a plurality of semiconductor lasers are driven. Alternatively, the method for driving semiconductor lasers of the present invention can be applied to cases in which a single semiconductor laser is driven. In addition, it goes without saying that the method for driving semiconductor lasers of the present invention may be applied to cases in which a plurality of semiconductor lasers are driven without multiplexing by optical fibers.

Further, when executing the method for driving semiconductor lasers of the present invention, the drive currents for semiconductor lasers in the OFF state may be a current slightly less than the oscillation threshold currents thereof, and not 0 mA. For example, for semiconductor lasers having an oscillation threshold current of 35 mA, a current of 30 mA maybe supplied thereto in their OFF state. Thereby, the temperature difference of the semiconductor lasers between their OFF and ON states can be reduced, and output fluctuations when the ACC drive method is implemented can be decreased.

The invention claimed is:

1. A method for driving a plurality of semiconductor lasers by automatic current control or automatic power control, comprising the steps of:

generating a pattern of drive current values for one of the semiconductor lasers, which is defined according to the amount of time which has elapsed since initiating driving thereof, that enables obtainment of substantially the same light output as a target light output by the automatic current control or the automatic power control; and varying the drive current of the semiconductor lasers in stepwise increments according to the pattern for a predetermined period of time from initiation of drive thereof; wherein:

a single pattern is utilized in common to drive the plurality of semiconductor lasers.

2. A method for driving semiconductor lasers as defined in claim 1, wherein:

the drive current of the semiconductor lasers is varied in stepwise increments according to the pattern for a predetermined period of time from initiation of drive thereof, with a common timing for the plurality of semiconductor lasers.

3. A method for driving semiconductor lasers as defined in claim 1, wherein:

the drive current of the semiconductor lasers is varied in stepwise increments according to the pattern for a predetermined period of time from initiation of drive thereof, with time lags among the plurality of semiconductor lasers, in the case that the laser beams emitted from the plurality of semiconductor lasers are combined.

4. A method for driving semiconductor lasers as defined in claim 1, wherein:

the pattern is defined as ratios of the drive current values with respect to a constant current value.

5. A method for driving semiconductor lasers as defined in claim 1, wherein:

a plurality of semiconductor lasers of an apparatus comprising the plurality of semiconductor lasers; and a multiplexing optical fiber, into which laser beams emitted by each of the plurality of semiconductor lasers enter to be multiplexed thereby; are driven.

6. A method for driving semiconductor lasers as defined in claim 1, wherein:

the semiconductor lasers to be driven are GaN type semiconductor lasers.

7. An apparatus for driving a plurality of semiconductor lasers by automatic current control or automatic power control, comprising:

memory means, in which a pattern of drive current values for one of the semiconductor lasers, which is defined according to the amount of time which has elapsed since initiating driving thereof, that enables obtainment of substantially the same light output as a target light output by the automatic current control or the automatic power control is recorded; and current controlling means, for varying the drive current of the semiconductor lasers in stepwise increments according to the pattern for a predetermined period of time from initiation of drive of the semiconductor lasers, and for utilizing a single pattern in common to drive the plurality of semiconductor lasers.

8. An apparatus for driving semiconductor lasers as defined in claim 7, wherein:

the current controlling means varies the drive current of the semiconductor lasers according to the pattern with a common timing for the plurality of semiconductor lasers.

9. An apparatus for driving semiconductor lasers as defined in claim 7, wherein:

in the case that laser beams emitted from the plurality of semiconductor lasers are multiplexed, the current controlling means varies the drive current of the semiconductor lasers according to the pattern, with time lags among the plurality of semiconductor lasers.

10. An apparatus for driving semiconductor lasers as defined in claim 7, wherein:

the pattern recorded in the memory means is defined as ratios of the drive current values of the semiconductor lasers with respect to a constant current value.

11. An apparatus for driving semiconductor lasers as defined in claim 7, wherein:

a plurality of semiconductor lasers of an apparatus comprising the plurality of semiconductor lasers; and a multiplexing optical fiber, into which laser beams emitted by each of the plurality of semiconductor lasers enter to be multiplexed thereby; are driven.

12. An apparatus for driving semiconductor lasers as defined in claim 7, wherein:

the semiconductor lasers to be driven are GaN type semiconductor lasers.

13. A method for deriving a pattern for driving semiconductor lasers, which is employed in the method for driving a plurality of semiconductor lasers as defined claim 1, comprising the steps of:

supplying a semiconductor lasers which is to be driven with a predetermined current;

detecting at least a portion of the light emitted from the semiconductor laser with a photodetector;

increasing/decreasing the current such that the output of the photodetector becomes constant;

detecting the current; and designating the increasing/decreasing pattern of the current as the pattern for driving the semiconductor lasers.

14. A method for deriving a pattern for driving semiconductor lasers as defined in claim 13, wherein:

the predetermined current is supplied to a plurality of semiconductor lasers to be driven simultaneously;

at least a portion of the light emitted from the plurality of semiconductor lasers is detected by photodetectors; and the predetermined current is increased/decreased simultaneously such that the outputs of the photodetectors become constant.

15. An apparatus for deriving a pattern for driving semiconductor lasers, which is employed by the apparatus for driving semiconductor lasers as defined in claim 7, comprising:

a constant current circuit, for supplying a semiconductor laser which is to be driven with a predetermined current;

a photodetector, for detecting at least a portion of the light emitted from the semiconductor laser;

means for increasing/decreasing the current such that the output of the photodetector becomes constant; and means for detecting the current and designating the increasing/decreasing pattern of the current as the pattern for driving the at least one semiconductor laser.

16. An apparatus for deriving a pattern for driving semiconductor lasers as defined in claim 15, wherein:

the constant current circuit supplies the predetermined current to a plurality of semiconductor lasers to be driven simultaneously;

the photodetector detects at least a portion of the light emitted from the plurality of semiconductor lasers is detected; and the means for increasing/decreasing the current simultaneously increases/decreases the predetermined current such that the outputs of the photodetectors become constant.

17. An exposure apparatus for exposing a photosensitive material with modulated light, comprising:
   at least one semiconductor laser;
   at least one light modulating element, for modulating light emitted by the plurality of semiconductor lasers; and
   an apparatus for driving semiconductor lasers as defined in claim 7.

* * * * *